US012693791B2

(12) United States Patent
Kim et al.

(10) Patent No.: US 12,693,791 B2
(45) Date of Patent: Jul. 28, 2026

(54) MEMORY DEVICE, MEMORY SYSTEM, AND OPERATING METHOD OF MEMORY DEVICE

(71) Applicant: SAMSUNG ELECTRONICS CO., LTD., Suwon-si (KR)

(72) Inventors: Tae Won Kim, Suwon-si (KR); Jun Myung Woo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 125 days.

(21) Appl. No.: 18/743,324

(22) Filed: Jun. 14, 2024

(65) Prior Publication Data

US 2025/0103217 A1 Mar. 27, 2025

(30) Foreign Application Priority Data

Sep. 25, 2023 (KR) ........................ 10-2023-0128351

(51) Int. Cl.
*G06F 3/06* (2006.01)
*G11C 11/406* (2006.01)
(52) U.S. Cl.
CPC .......... *G06F 3/0619* (2013.01); *G06F 3/0659* (2013.01); *G06F 3/0673* (2013.01); *G11C 11/406* (2013.01)
(58) Field of Classification Search
CPC .... G06F 3/0619; G06F 3/0659; G06F 3/0673; G11C 11/406
USPC ....................................................... 711/154
See application file for complete search history.

(56) References Cited

U.S. PATENT DOCUMENTS

| | | | |
|---|---|---|---|
| 8,879,733 B2 | 11/2014 | Goettfert et al. | |
| 9,478,316 B1 * | 10/2016 | Ryu | G11C 29/76 |
| 10,430,101 B2 | 10/2019 | Atsumi et al. | |
| 10,636,476 B2 | 4/2020 | Nale | |
| 10,891,083 B2 | 1/2021 | Nair et al. | |
| 11,388,078 B1 * | 7/2022 | Sommers | H04L 43/50 |
| 11,586,418 B2 | 2/2023 | Tseng et al. | |
| 2012/0185654 A1 | 7/2012 | Kim et al. | |

(Continued)

FOREIGN PATENT DOCUMENTS

| | | | |
|---|---|---|---|
| CN | 114678050 A * | 6/2022 | G11C 11/4078 |

OTHER PUBLICATIONS

Machine translation of CN-114678050-A (Year: 2022).*

*Primary Examiner* — Reginald G Bragdon
*Assistant Examiner* — Aaron D Ho
(74) *Attorney, Agent, or Firm* — MORGAN, LEWIS & BOCKIUS LLP

(57) ABSTRACT

A memory device includes a memory cell array including memory cell rows, a first random number generator generating an n-bit first pseudo random bit sequence signal based on a first seed and a first degree, first and second memory cell row picking circuits, and a refresh control circuit. The first memory cell row picking circuit randomly selects a first memory cell row at a first cycle, and stores a row address of the selected first memory cell row in a first queue. The second memory cell row picking circuit randomly selects a second memory cell row at a second cycle, and stores a row address of the selected second memory cell row in a second queue. The refresh control circuit performs a refresh operation on memory cell rows physically adjacent to memory cell rows corresponding to each of the row addresses stored in the first queue and the second queue.

20 Claims, 19 Drawing Sheets

(56) References Cited

U.S. PATENT DOCUMENTS

| | | | | |
|---|---|---|---|---|
| 2014/0156923 | A1* | 6/2014 | Bains | G11C 11/40611 |
| | | | | 711/106 |
| 2019/0333573 | A1* | 10/2019 | Shin | G11C 11/40618 |
| 2020/0066342 | A1* | 2/2020 | Ha | G11C 29/52 |
| 2021/0367617 | A1* | 11/2021 | Torbatian | G06F 7/582 |
| 2021/0375348 | A1* | 12/2021 | Lee | G11C 29/4401 |
| 2021/0382638 | A1 | 12/2021 | Anderson et al. | |
| 2022/0051711 | A1* | 2/2022 | Ayyapureddi | G06F 7/58 |
| 2022/0122686 | A1* | 4/2022 | Burg | H03M 13/116 |
| 2022/0208251 | A1* | 6/2022 | Hong | G11C 11/40603 |
| 2022/0317975 | A1 | 10/2022 | Li et al. | |
| 2023/0141789 | A1 | 5/2023 | Sunghye et al. | |
| 2023/0170009 | A1* | 6/2023 | Bang | G11C 11/4091 |
| | | | | 365/103 |
| 2023/0221869 | A1* | 7/2023 | Cho | G11C 11/4087 |
| | | | | 711/154 |
| 2024/0038291 | A1* | 2/2024 | Gieske | G11C 11/4076 |
| 2024/0112717 | A1* | 4/2024 | Rooney | G11C 11/406 |
| 2024/0379148 | A1* | 11/2024 | Lu | G11C 11/4078 |
| 2025/0085870 | A1* | 3/2025 | Yang | G06F 3/062 |

* cited by examiner

T_REF1

T1_Monitoring

T_REF2

T2_Monitoring

T_REF3

Time

Row Hammer Care(Refresh)

Row Hammer

Figure 9:
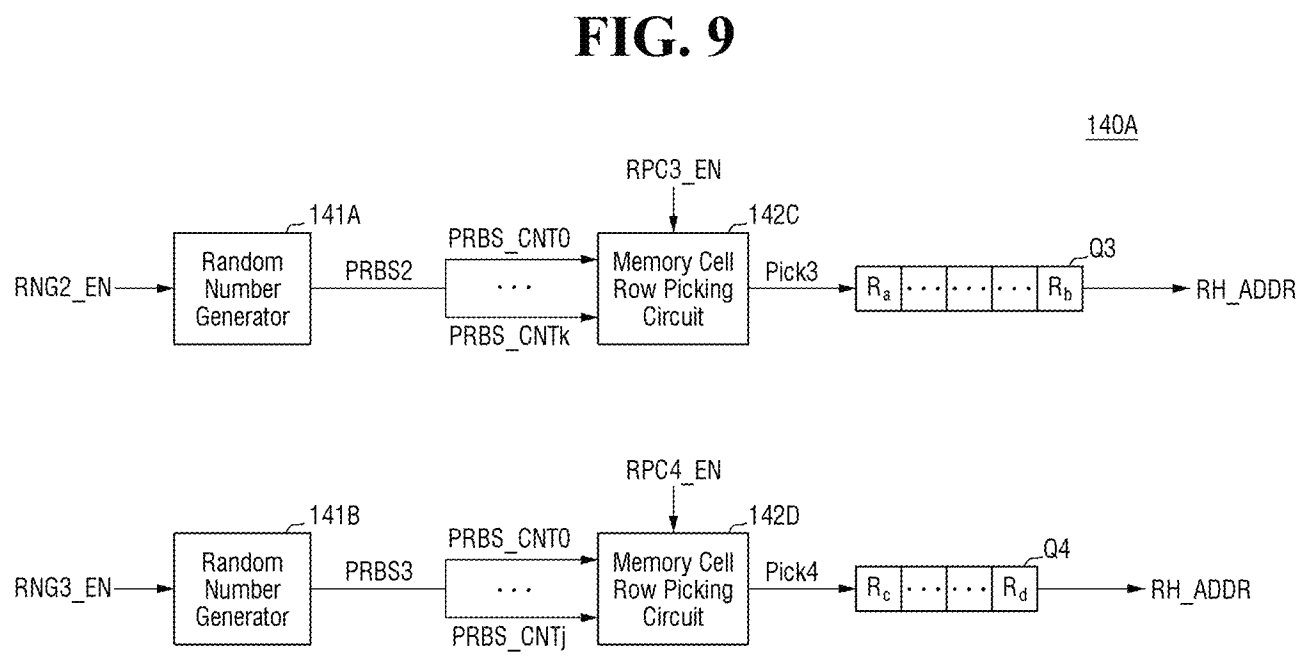

RNG2_EN → 141A Random Number Generator

PRBS2 → PRBS_CNT0 ⋯ PRBS_CNTk

RPC3_EN → 142C Memory Cell Row Picking Circuit

Pick3 → | Ra | ⋯ | Rb | Q3 → RH_ADDR

RNG3_EN → 141B Random Number Generator

PRBS3 → PRBS_CNT0 ⋯ PRBS_CNTj

RPC4_EN → 142D Memory Cell Row Picking Circuit

Pick4 → | Rc | ⋯ | Rd | Q4 → RH_ADDR

MEMORY DEVICE, MEMORY SYSTEM, AND OPERATING METHOD OF MEMORY DEVICE

CROSS-REFERENCE TO RELATED APPLICATION

This application claims priority under 35 U.S.C. § 119 to Korean Patent Application No. 10-2023-0128351 filed on Sep. 25, 2023, the disclosure of which is incorporated by reference herein in its entirety.

TECHNICAL FIELD

Embodiments of the present disclosure relate to a memory device, a memory system, and a method of operating the memory device.

DISCUSSION OF RELATED ART

As the degree of integration of memory devices increases, an interval between a plurality of word lines included in the memory devices decreases. As an interval between the word lines decreases, a coupling effect between adjacent word lines increases. Each time data is input and output to and from a memory cell, a word line toggles between an active state and an inactive state. A phenomenon may occur in which data of the memory cells connected to a word line adjacent to a word line that is often activated are corrupted with an increase in the coupling effect between adjacent word lines. Such a phenomenon is referred to as row hammering, in which data of the memory cell may become corrupted before the memory cell is refreshed due to word line disturbance.

SUMMARY

Aspects of the present disclosure provide a memory device in which data reliability is improved against the row hammer phenomenon.

Aspects of the present disclosure also provide a memory system in which data reliability is improved against the row hammer phenomenon.

Aspects of the present disclosure also provide a method of operating the memory device in which data reliability is improved against the row hammer phenomenon.

According to an aspect of the present disclosure, there is provided a memory device including a memory cell array including a plurality of memory cell rows, a first random number generator configured to generate an n-bit first pseudo random bit sequence signal based on a first seed and a first degree, a first memory cell row picking circuit configured to randomly select a first memory cell row among the plurality of memory cell rows at a first cycle, in response to specific m bits among the received n-bit first pseudo random bit sequence signal matching each other, and store a row address of the selected first memory cell row in a first queue, a second memory cell row picking circuit configured to randomly select a second memory cell row among the plurality of memory cell rows at a second cycle different from the first cycle, in response to specific k bits among the received n-bit first pseudo random bit sequence signal matching each other, and store a row address of the selected second memory cell row in a second queue different from the first queue, and a refresh control circuit configured to perform a refresh operation on memory cell rows physically adjacent to memory cell rows corresponding to each of row addresses stored in the first queue and the second queue, where each of n, m, and k is an integer of 2 or more, and n, m, and k are different from each other.

According to an aspect of the present disclosure, there is provided a memory system including a memory controller configured to generate a row hammer refresh command based on a command received from a host, a memory cell array including a plurality of memory cell rows, a row hammer control circuit configured to receive the row hammer refresh command and output a row hammer address corresponding to at least one memory cell row that is subjected to a row hammer during a row hammer monitoring time interval among the plurality of memory cell rows, in response to the received row hammer refresh command, and a refresh control circuit configured to perform a refresh operation on memory cell rows physically adjacent to memory cell rows corresponding to the row hammer address, based on the received row hammer address. The row hammer control circuit includes a first random number generator configured to generate an n-bit first pseudo random bit sequence signal based on a first seed and a first degree, a first memory cell row picking circuit configured to randomly select a first memory cell row among the plurality of memory cell rows at a first cycle, in response to specific m bits among the received n-bit first pseudo random bit sequence signal matching each other, and store a row address of the selected first memory cell row in a first queue, a second random number generator configured to generate a k-bit second pseudo random bit sequence signal based on a second seed and a second degree, and a second memory cell row picking circuit configured to randomly select a second memory cell row among the plurality of memory cell rows at a second cycle different from the first cycle, in response to specific j bits among the received k-bit second pseudo random bit sequence signal matching each other, and store the row address of the selected second memory cell row in a second queue different from the first queue. The row hammer control circuit provides the row addresses stored in the first queue and the second queue to the refresh control circuit as the row hammer address, the first seed and the second seed are different from each other, or the first degree and the second degree are different from each other, and each of n, m, k, and j is an integer of 2 or more.

According to an aspect of the present disclosure, there is provided a method of operating a memory device including a memory cell array including a plurality of memory cell rows, a first random number generator configured to generate an n-bit first pseudo random bit sequence signal, a first memory cell row picking circuit and a second memory cell row picking circuit configured to respectively randomly select at least one memory cell row among the plurality of memory cell rows based on the first pseudo random bit sequence signal, and a refresh control circuit configured to perform a refresh operation on memory cell rows physically adjacent to memory cell rows selected by the first memory cell row picking circuit and the second memory cell row picking circuit. The method includes generating the n-bit first pseudo random bit sequence signal based on a first seed and a first degree, by the first random number generator, randomly selecting one memory cell row among the plurality of memory cell rows at a first cycle, by the first memory cell row picking circuit, in response to specific m bits among the received n-bit first pseudo random bit sequence signal matching each other, storing a row address of the selected memory cell row in a first queue, by the first memory cell row picking circuit, randomly selecting one memory cell row among the plurality of memory cell rows at a second cycle different from the first cycle, by the second memory cell row picking circuit, in response to specific k bits among the received n-bit first pseudo random bit sequence signal matching each other, storing the row address of the selected memory cell row in a second queue different from the first queue, by the second memory cell row picking circuit, and performing a refresh operation on memory cell rows physically adjacent to the memory cell rows corresponding to each of row addresses stored in the first queue and the second queue, by the refresh control circuit, where ach of n, m, and k is an integer of 2 or more, and n, m, and k are different from each other.

BRIEF DESCRIPTION OF THE DRAWINGS

The above and other aspects and features of the present disclosure will become more apparent by describing in detail embodiments thereof with reference to the accompanying drawings.

FIG. 1 is an example diagram showing a configuration of a memory system according to some embodiments.

FIG. 2 is an example diagram showing a configuration of a memory device according to some embodiments.

FIG. 3 is an example diagram showing a configuration of a row hammer control circuit according to some embodiments.

FIG. 9 is an example diagram showing a configuration of the row hammer control circuit of FIG. 3 according to some embodiments.

FIG. 10 is an example diagram showing a configuration of a flag signal generation circuit according to some embodiments.

FIGS. 13 to 15 are example diagrams for describing a row hammer control circuit according to some embodiments.

DETAILED DESCRIPTION OF THE EMBODIMENTS

Figure 4:
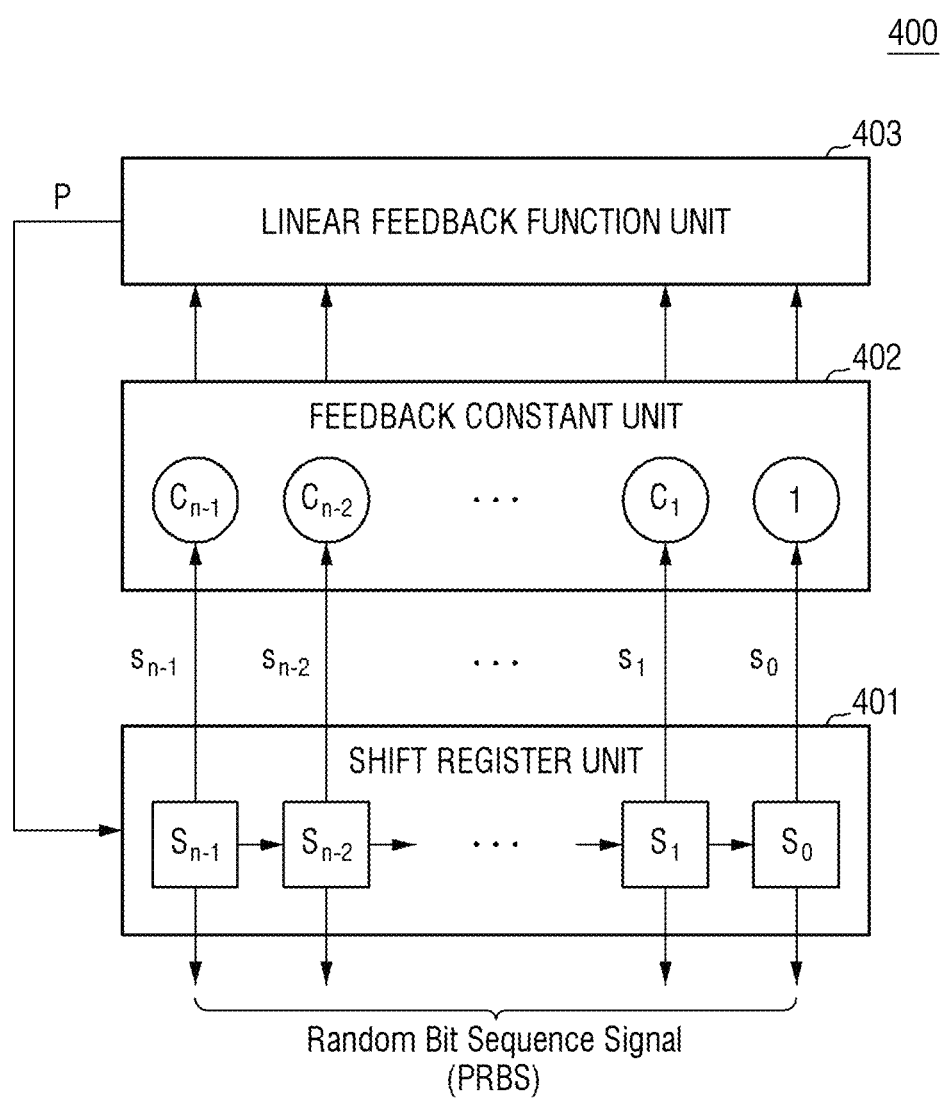
FIG. 4 is an example diagram for describing a random number generator of FIG. 3.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms.

Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Hereinafter, a memory device, a memory system, and a method of operating the memory device according to some embodiments will be described with reference to the accompanying drawings.

Figure 1:
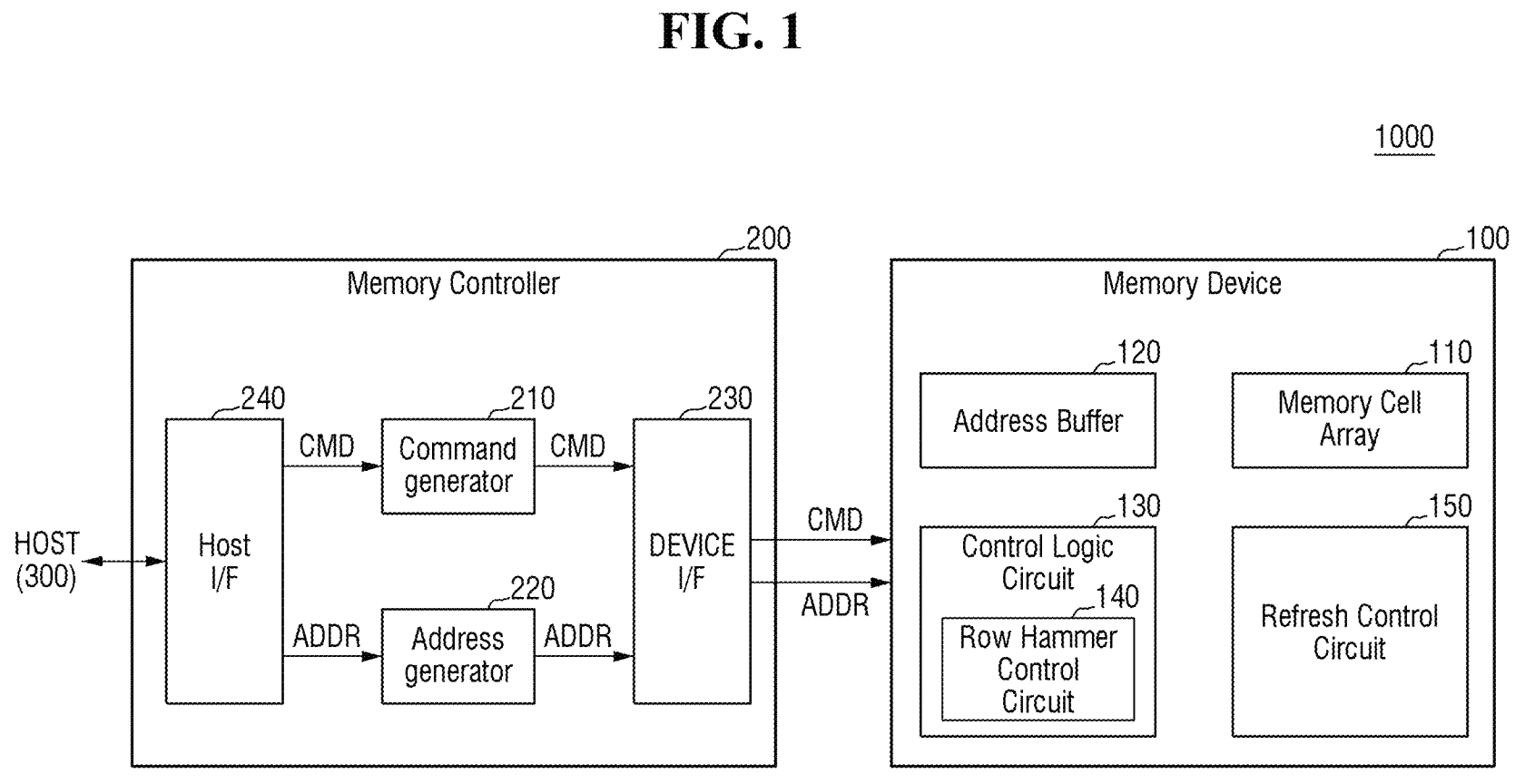

FIG. 1 is an example diagram showing a configuration of a memory system according to some embodiments.

Referring to FIG. 1, a memory system 1000 may include a memory device 100 and a memory controller 200. The memory controller 200 may send and receive data to and from a host device 300, and may send a command CMD and an address ADDR to the memory device 100. The memory controller 200 may include a host interface 240, a command generator 210, an address generator 220, and a device interface 230.

The host interface 240 may receive the command CMD and the address ADDR from the host device 300, and the command generator 210 may generate an access command and a row hammer refresh command by decoding the command CMD received from the host device 300, and provide the access command and the row hammer refresh command to the memory device 100 through the device interface 230.

The access command may be a signal that instructs the memory device 100 to read or write data by accessing a memory cell row of the memory cell array 110 corresponding to the address ADDR. The row hammer refresh command may be a signal that instructs an additional refresh operation to be performed on memory cell rows that are physically adjacent to the memory cell rows that are accessed intensively for a short period of time.

In the following description, the terms "the row" of the memory cell array 110 and "the memory cell row" of the memory cell array 110 may be used interchangeably. Furthermore, regarding the row hammer refresh command, a memory cell row that is intensively accessed in the short period of time is referred to as a "target row."

In the following description, performing the refresh operation on the memory cell row physically adjacent to the memory cell row that is subjected to a row hammer attack will be referred to as row hammer care.

The address generator 220 of the memory controller 200 may generate a row address and a column address to be accessed in the memory cell array 110, by decoding the address ADDR received from the host interface 240. Furthermore, the memory device 100 may generate addresses of banks to be accessed when the memory cell array 110 includes the multiple banks.

Additionally, the memory controller 200 may control memory operations, such as writing and reading, by providing various signals to the memory device 100 through the device interface 230. For example, the memory controller 200 may provide a pre-charge command to the memory device 100. The pre-charge command may be a command for switching the state of the memory cell array 110 from an active state to a standby state after writing or reading is completed.

According to some embodiments, when the memory controller 200 provides an access command to the memory device 100, the address ADDR of the row to be accessed may be sent to the memory device 100 along with the access command. When the memory controller 200 provides a row hammer refresh command to the memory device 100, the addresses of the target rows in which the accesses are concentrated may be sent to the memory device 100 along with the row hammer refresh command. When the memory device 100 receives the row hammer refresh command and the addresses of the target row, an additional refresh operation may be performed on word lines physically adjacent to the word line corresponding to the target rows (or memory cell rows physically adjacent to the memory cell row corresponding to the target row).

The memory device 100 is a storage device based on a semiconductor element, and may include a memory cell array 110, an address buffer 120, a control logic circuit 130, a row hammer control circuit 140, and a refresh control circuit 150. As an example, the memory device 100 may be provided as a random access memory (RAM) device, such as a Dynamic Random Access Memory (DRAM), a Synchronous DRAM (SDRAM), a Static RAM (SRAM), a Double Date Rate SDRAM (DDR SDRAM), a DDR2 SDRAM, a DDR3 SDRAM, a Phase-change RAM (PRAM), a Magnetic RAM (MRAM), and a Resistive RAM (RRAM).

Further, any memory device 100 that utilizes a refresh operation may be applied as the memory device 100. For example, when the resistive memory device 100 performs the refresh operation as a nonvolatile memory, the memory device 100 may be a nonvolatile memory device 100. The memory device 100 may receive or output data through data lines or perform the refresh operation in response to the address ADDR and the command CMD received from the memory controller 200.

The memory cell array 110 includes a plurality of memory cells, and the plurality of memory cells may be connected to the word lines and the bit lines. The control logic circuit 130 may write data to or read data from the memory cell array 110 on the basis of the command CMD and the address ADDR received from the memory controller 200, or may provide a control signal for refreshing the memory cells included in the memory cell array 110 to a row decoder and a column decoder. In this way, the control logic circuit 130 may perform overall operations for processing data of the memory cell array 110.

The memory device 100 may perform a normal refresh operation on at least some of the memory cells of the memory cell array 110 in response to a normal refresh command from the memory controller 200. At this time, when the memory device 100 performs the normal refresh operation, the memory cell rows of the memory cell array 110 may be sequentially refreshed.

Additionally, the memory device 100 may perform the refresh operation (e.g., row hammer care) on at least some of the memory cells of the memory cell array 110 in response to the row hammer refresh command from the memory controller 200. When the memory device 100 performs the refresh operation in response to the row hammer refresh command, the refresh operation may be performed on the word lines adjacent to the word lines corresponding to the target row.

Figure 2:
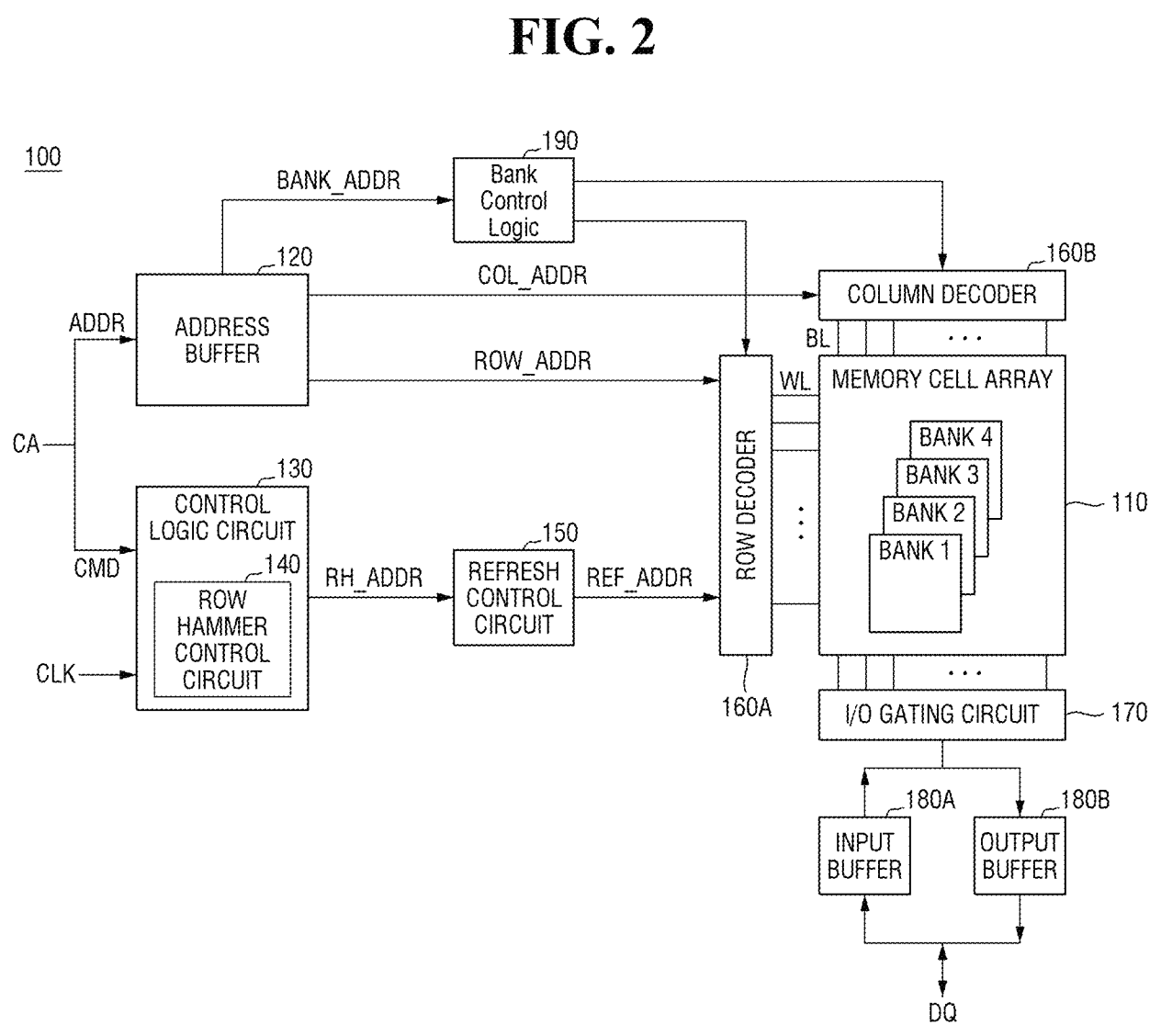

FIG. 2 is an example diagram showing a configuration of a memory device according to some embodiments.

Referring to FIG. 2, the memory device 100 may include a memory cell array 110, a row decoder 160A, a column decoder 160B, an input/output gating circuit 170, a control logic circuit 130, an address buffer 120, a bank control logic circuit 190, a refresh control circuit 150, a data input buffer 180A, and a data output buffer 180B. In some embodiments, the memory device 100 may further include a clock buffer, a mode register set (MRS), a voltage generation circuit, and the like.

The address buffer 120 may receive addresses ADDR including a bank address BANK_ADDR, a row address ROW_ADDR, and a column address COL_ADDR from the memory controller 200 (shown in FIG. 1). The address buffer 120 may provide the received bank address BANK_ADDR to the bank control logic circuit 190, provide the received row address ROW_ADDR to the row decoder 160A, and provide the received column address COL_ADDR to the column decoder 160B.

The memory cell array 110 may include a plurality of memory cells provided in the form of a matrix arranged in rows and columns. The memory cell array 110 may include a plurality of word lines WL and a plurality of bit lines BL connected to the memory cells. The plurality of word lines WL may be connected to rows of the memory cells, and the plurality of bit lines BL may be connected to columns of the memory cells. Data of the memory cells connected to the activated word line WL may be sensed and amplified by sense amplifiers connected to the bit line BL.

The memory cell array 110 may include first to fourth banks BANK1 to BANK4. The bank control logic circuit 190 may generate bank control signals in response to the bank address BANK_ADDR. The row decoder 160A may be one of a plurality of row decoders 160A, and the column decoder 160B may be one of a plurality of column decoders 160B. In response to the generated bank control signal, the row decoder 160A and the column decoder 160B of the bank corresponding to the bank address among the first to fourth banks BANK1 to BANK4 may be activated. Although the memory device 100 is shown in FIG. 2 to include four banks, embodiments are not limited thereto. For example, in some embodiments, the memory device 100 may include any number of banks.

The plurality of row decoders 160A and the plurality of column decoders 160B may be placed to correspond to each of the first to fourth banks BANK1 to BANK4, and the row decoders 160A and 160B and the column decoder 160B connected to the bank corresponding to the bank address BANK_ADDR may be activated. The row decoder 160A may decode the row address ROW_ADDR received from the address buffer 120, select a word line WL corresponding to the row address ROW_ADDR among the plurality of word lines WL, and may be connected to a word line driver that activates the selected word line WL.

The column decoder 160B may select a predetermined bit line BL among the plurality of bit lines BL of the memory cell array 110. The column decoder 160B may generate a column picking signal by decoding a burst address that gradually increases by +1 on the basis of the column address COL_ADDR in a burst mode, and connect the bit lines BL selected by the generated column picking signal to the input/output gating circuit 170. The burst address refers to addresses of column locations that are accessible in relation to the burst length BL for reading and/or writing commands.

The input/output gating circuit 170 may include read data latches that store read data of the bit line BL selected by the column picking signal, and a write driver that writes the write data on the memory cell array 110. The read data stored in the read data latch of the input/output gating circuit 170 may be provided to a data (DQ) bus through the data output buffer 180B. The write data may be written on the memory cell array 110 through the data input buffer 180A connected to the data (DQ) bus, and through the write driver of the input/output gating circuit 170.

The control logic circuit 130 may receive the clock signal CLK and the command CMD and generate control signals that control the operation timing and/or memory operation of the memory device 100. The control logic circuit 130 may provide the control signals to circuits of the memory device 100 to operate as set in operating and control parameters stored by the MRS. The control logic circuit 130 may read data from and write data to the memory cell array 110 using the control signals. Although the control logic circuit 130 and the address buffer 120 are shown as separate components in FIGS. 1 and 2, embodiments are not limited thereto. For example, in some embodiments, the control logic circuit 130 and the address buffer 120 may be implemented as a single component. In addition, although the command CMD and address ADDR are shown as being provided as separate signals in FIG. 2, as present in a Low Power Double Data Rate (LPDDR) standard or the like, in some embodiments, the address may be considered as being included in the command.

The control logic circuit 130 may be configured to detect one or more row hammer addresses RH_ADDR that are intensively accessed during the row hammer monitoring time interval, and perform the target refresh on the memory cell rows adjacent to the memory cell row physically adjacent to the memory cell rows corresponding to the detected row hammer address RH_ADDR. The control logic circuit 130 includes a row hammer control circuit 140 that detects a target row that is subjected to a row hammer attack during the row hammer monitoring time interval, and provides the row address of the target row to the refresh control circuit 150 as the row hammer address RH_ADDR. The row hammer control circuit 140 will be described below with reference to FIG. 3.

The control logic circuit 130 may control the refresh control circuit 150 to perform the normal refresh operation by increasing the refresh counter value by +1 in response to the refresh command CMD. The control logic circuit 130 may also control the refresh control circuit 150 to perform the target row refresh operation (e.g., row hammer care) on the basis of the row hammer address RH_ADDR. The refresh control circuit 150 may generate a refresh address REF_ADDR corresponding to a memory cell row on which the normal refresh operation and/or the target row refresh operation is performed. When the refresh control circuit 150 performs the target row refresh operation, the refresh address REF_ADDR output from the refresh control circuit 150 may represent the row addresses of the memory cell rows physically adjacent to the target row that is subjected to the row hammer attack.

Figure 3:
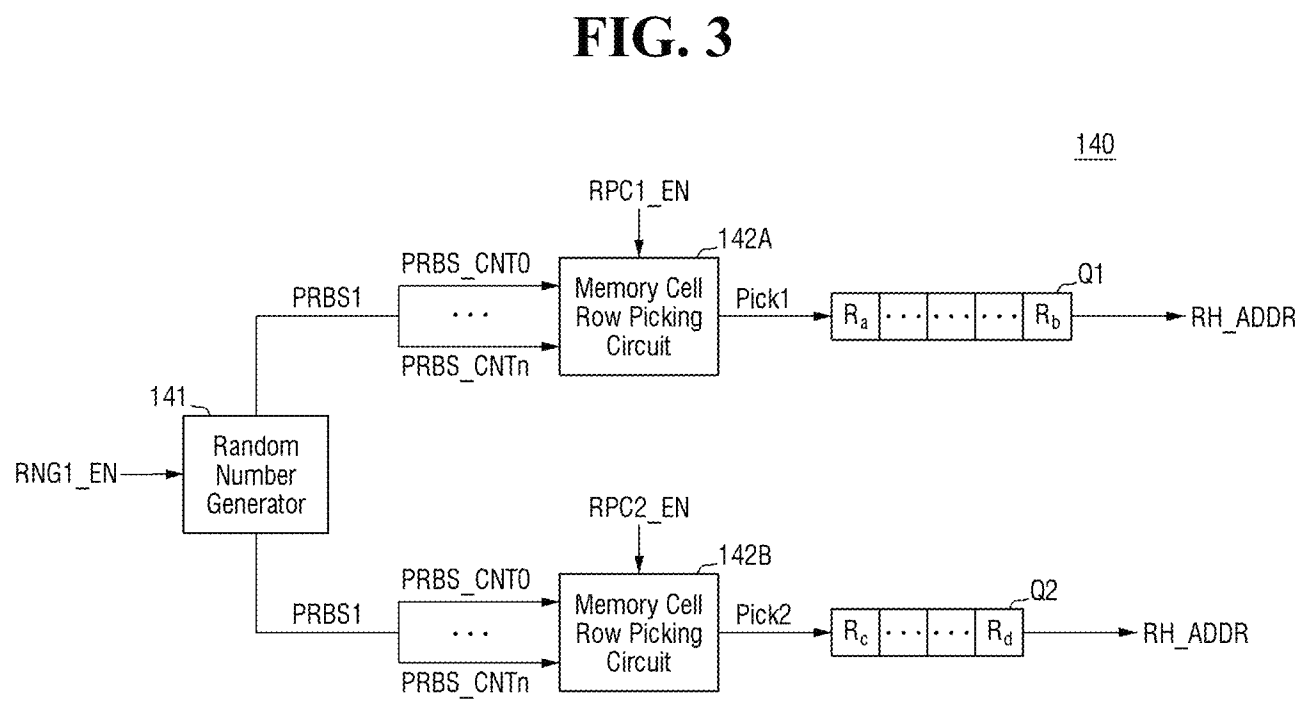

FIG. 3 is an example diagram showing a configuration of a row hammer control circuit according to some embodiments.

Referring to FIG. 3, the row hammer control circuit 140 may include a random number generator 141, a memory cell row picking circuit 142A, and a memory cell row picking circuit 142B. The random number generator 141 may operate as the enable signal RNG1_EN is applied. The random number generator 141 may generate random numbers using an algorithm used for the random number generation, and may have hardware logic for the random number generation. The random number generator 141 may also be referred to as a random number generator circuit.

In some embodiments, the random number generator 141 may be implemented as a linear feedback shift register (here, n is an integer of 2 or more) that generates an n-bit pseudo random bit sequence signal 1 (PRBS1), on the basis of a first seed and a first degree. The linear feedback shift register will be described below with reference to FIG. 4.

The memory cell row picking circuit 142A may operate as the enable signal RPC1_EN is applied. The memory cell row picking circuit 142A may receive an n-bit pseudo random bit sequence signal PRBS1 from the random number generator 141. When the enable signal RPC1_EN is applied to the memory cell row picking circuit 142A, the memory cell row picking circuit 142A may randomly select one memory cell row among the plurality of memory cell rows of the memory cell array 110 (shown in FIG. 2), on the basis of the received n-bit pseudo random bit sequence signal PRBS1. At this time, the memory cell row selected by the memory cell row picking circuit 142A may be a target row that is intensively accessed during the row hammer monitoring time interval of the control logic circuit 130, that is, a memory cell row that has been subjected to a row hammer attack. Furthermore, the memory cell row picking circuit 142A may select the memory cell rows one by one at a cycle T1.

When the memory cell row picking circuit 142A selects one memory cell row at the cycle T1, the memory cell row picking circuit 142A may output a picking signal Pick1 of logic high. On the basis of the logic high picking signal Pick1, the memory cell row picking circuit 142A may store the row address of the selected memory cell row in a queue Q1. At this time, the queue Q1 may be exclusively assigned to the memory cell row picking circuit 142A. That is, the memory cell row picking circuit 142A may store the row address of the selected memory cell row only in the queue Q1. The row addresses stored in the queue Q1 may be provided to the refresh control circuit 150 (shown in FIG. 2) as a row hammer address RH_ADDR of FIG. 2. Thereafter, the refresh control circuit 150 may generate a refresh address REF_ADDR corresponding to the memory cell row on which the target row refresh operation (e.g., row hammer care operation) is to be performed on the basis of the received row hammer address RH_ADDR.

The memory cell row picking circuit 142B may operate as the enable signal RPC2_EN is applied. Since the memory cell row picking circuit 142A and the memory cell row picking circuit 142B are operated by different enable signals from each other, one of the memory cell row picking circuit 142A and the memory cell row picking circuit 142B is turned on and operated, and the other one may be turned off and not be operated.

Like the memory cell row picking circuit 142A, the memory cell row picking circuit 142B may receive the n-bit pseudo random bit sequence signal PRBS1 from the random number generator 141, and may randomly select one memory cell row among the plurality of memory cell rows of the memory cell array 110 on this basis. At this time, the memory cell row selected by the memory cell row picking circuit 142B may be a target row which is intensively accessed during the row hammer monitoring time interval of the control logic circuit 130, that is, a memory cell row that is subjected to the row hammer attack. At this time, the memory cell row picking circuit 142B may select the memory cell rows one by one at a cycle T2.

At this time, the cycle T1 at which the memory cell row picking circuit 142A selects one memory cell row, and the cycle T2 at which the memory cell row picking circuit 142B selects one memory cell row, may each be an average cycle.

The average cycle at which the memory cell row picking circuit selects one memory cell row will be described below with reference to FIG. 5.

In some embodiments, the cycle T1 at which the memory cell row picking circuit 142A selects the memory cell row may be different from the cycle T2 at which the memory cell row picking circuit 142B selects the memory cell row. That is, although both the memory cell row picking circuit 142A and the memory cell row picking circuit 142B receive the same n-bit pseudo random bit sequence signal PRBS1 from the random number generator 141, the cycles for selecting the memory cell rows may be different from each other depending on the operations of each of the memory cell row picking circuits 142A and 142B. The operation of each of the memory cell row picking circuits 142A and 142B will be described below with reference to FIGS. 5 and 6.

When the memory cell row picking circuit 142B selects one memory cell row at the cycle T2, the memory cell row picking circuit 142B may output a picking signal Pick2 of logic high. On the basis of the logic high picking signal Pick2, the memory cell row picking circuit 142B may store the row address of the selected memory cell row in the queue Q2. At this time, the queue Q2 may be exclusively assigned to the memory cell row picking circuit 142B. That is, the memory cell row picking circuit 142B may store the row address of the selected memory cell row only in the queue Q2. The row addresses stored in the queue Q2 may be provided to the refresh control circuit 150 (shown in FIG. 2) as the row hammer address RH_ADDR of FIG. 2. Thereafter, the refresh control circuit 150 may generate the refresh address REF_ADDR corresponding to the memory cell row on which the target row refresh operation (e.g., row hammer care operation) is to be performed on the basis of the received row hammer address RH_ADDR.

On the other hand, when the refresh control circuit 150 performs the target row refresh operation, the order between the row addresses stored in the queue Q1 and the row addresses stored in the queue Q2 may be defined. The order by which the refresh control circuit 150 performs the target row refresh operation on the row addresses stored in the queue Q1 and the row addresses stored in the queue Q2 will be described below with reference to FIGS. 10 to 12. FIG. 4 is an example diagram for describing the random number generator of FIG. 3.

Referring to FIG. 4, the random number generator 141 of FIG. 3 may be implemented as a linear feedback shift register 400. The linear feedback shift register 400 may generate and output a linear random number sequence on the basis of a primitive polynomial. The linear feedback shift register 400 may include a shift register unit 401, a feedback constant unit 402, and a linear feedback function unit 403.

The shift register unit 401 includes n shift registers ($S_0$, $S_1$, . . . , $S_{n-1}$). The n shift registers ($S_0$, $S_1$, . . . , $S_{n-1}$) may receive the output P of the linear feedback function unit 403, and shift and output outputs ($S_0$, $S_1$, . . . , $S_{n-1}$) of each stage of the shift registers ($S_0$, $S_1$, . . . , $S_{n-1}$) to each stage of the feedback constant unit 402 on a one-to-one basis.

The feedback constant unit 402 may take values of modes 0 and 1 as coefficients of the primitive polynomial, and have a value of $C_i$ ($C_0$=1, i=1, 2 . . . ) indicating the connection state with the shift register unit 401. The feedback constant unit 402 may receive the outputs (so, $S_1$, . . . , $S_{n-1}$) of the shift register unit 401, and output them to the linear feedback function unit 403 together with the own constant value $C_i$ ($C_0$=1, i=1, 2 . . . ). The linear feedback function unit 403 and the feedback constant unit 402 receive outputs ($S_0$, $S_1$, . . . , $S_{n-1}$) of the shift register 201 of each stage, generate the output P by equation 1, and output them to the shift register unit 401

$$P = s_0 + C_1 s_1 + \ldots + C_{n-1} s_{n-1} \qquad \text{[Equation 1]}$$

The operating process of the linear feedback shift register 400 is as follows. The linear feedback function unit 403 calculates and outputs the output P. Thereafter, the shift register unit 401 outputs all bits ($S_0$, $S_1$, . . . , $S_{n-1}$), and receives and shifts the output P of the linear feedback function unit 403. The outputs ($S_0$, $S_1$, . . . , $S_{n-1}$) of the shift registers ($S_0$, $S_1$, . . . , $S_{n-1}$) are output to the feedback constant unit 402. All bits ($S_0$, $S_1$, . . . , $S_{n-1}$) of the shift register unit 401, which are output each time this operating process is repeated, may be output as random values. The output bits of the shift register unit 401 may be output as a pseudo random bit sequence signal PRBS. The seed corresponding to the initial bit value of the linear feedback shift register 400 and/or the degree corresponding to the number of bits included in one cycle of the output signal of the linear feedback shift register 400 may vary according to embodiments.

Figure 5:
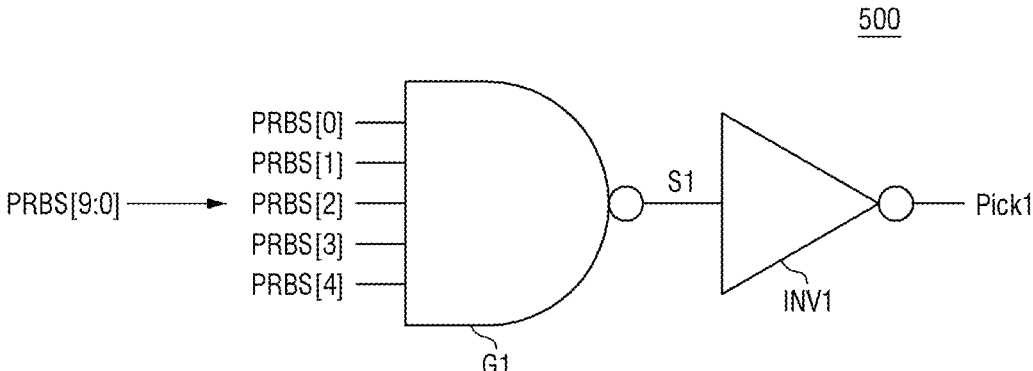
FIGS. 5 to 7 are example diagrams for describing memory cell row picking circuits of FIG. 3.
Figure 6:
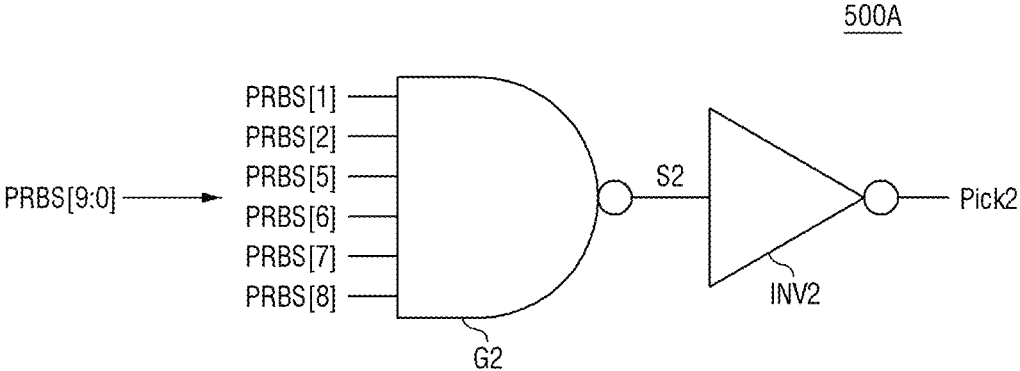
Figure 7:
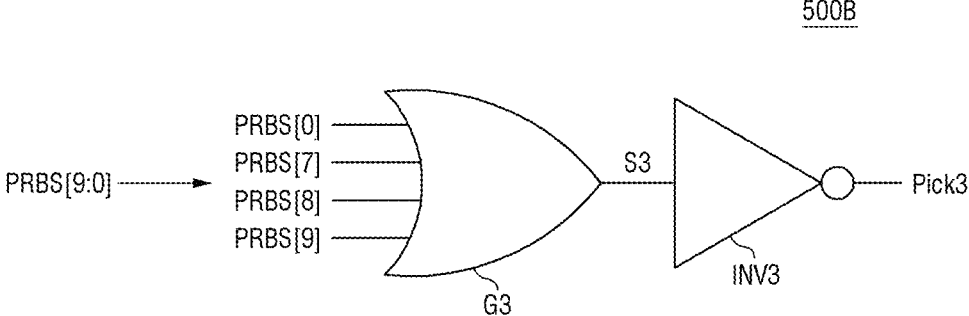

FIGS. 5 to 7 are example diagrams for describing the memory cell row picking circuits of FIG. 3.

The memory cell row picking circuits 142A and 142B of FIG. 3 may be implemented as any one of the memory cell row picking circuits 500, 500A, and 500B of FIGS. 5 to 7, respectively. In the following description, although an example will be described in which the memory cell row picking circuit 142A is implemented as the memory cell row picking circuit 500 of FIG. 5, and the memory cell row picking circuit 142B is implemented as the memory cell row picking circuit 500A of FIG. 6, embodiments are not limited thereto.

In the following description, an example will be given in which the random number generator 141 of FIG. 3 outputs a 10-bit pseudo random bit sequence signal PRBS [9:0]. However, embodiments are not limited thereto. For example, in some embodiments, the number of bits of the pseudo random bit sequence signal generated by the random number generator 141 may vary depending on the degree of the random number generator 141.

Referring first to FIG. 5, the memory cell row picking circuit 500 may include a logic gate G1 and an inverter INV1. The memory cell row picking circuit 500 may receive the 10-bit pseudo random bit sequence signal PRBS [9:0] that is output from the random number generator 141. The logic gate G1 of the memory cell row picking circuit 500 may receive input of specific bits among the 10-bit pseudo random bit sequence signal PRBS [9:0] that is output from the random number generator 141. For example, as shown in FIG. 5, the logic gate G1 may receive input of PRBS [0], PRBS [1], PRBS [2], PRBS [3], and PRBS [4] among the 10-bit pseudo random bit sequence signal PRBS [9:0]. The logic gate G1 may perform a NAND computation on the input signal, and output the result thereof as signal $S_1$. For example, when the signal PRBS [4:0] that is input to the logic gate G1 is "11111", a logic low signal $S_1$ may be output.

The logic low signal $S_1$ is input to the inverter INV1, and may output a picking signal Pick1 of logic high. The picking signal Pick1 that is output from the inverter INV1 may correspond to the picking signal Pick1 that is output from the memory cell row picking circuit 142A of FIG. 3. The memory cell row picking circuit 500 may select one memory cell row among the plurality of memory cell rows of the memory cell array 110 (shown in FIG. 1) each time the memory cell row picking circuit 500 outputs the picking signal Pick1 of logic high.

In this way, the cycle T1 at which the memory cell row picking circuit 500 outputs the logic high picking signal Pick1, that is, the cycle T1 at which the memory cell row picking circuit 500 selects one memory cell row among the plurality of memory cell rows in the memory cell array 110, may be determined by the following equation 2.

$$T = 2^m TRC \; (m =$$ [Equation 2]

specific number of bits that match each other, $TRC =$ minimum time interval between acts)

According to Equation 2 above, the memory cell row picking circuit 500 may select one memory cell row in cycle of 32 TRC. That is, the memory cell row picking circuit 500 may select one memory cell row per 32 acts on average. Here, 1 act may mean one row hammer attack during the row hammer monitoring time interval of the control logic circuit 130 (shown in FIG. 1). That is, the memory cell row picking circuit 500 may select one target row, when there are an average of 32 row hammer attacks during the row hammer monitoring time interval.

The cycle T1 at which the memory cell row picking circuit 500 selects one target row is determined on the basis of the pseudo random bit sequence signal PRBS1 that is output from the random number generator 141, and therefore may correspond to the average cycle. For example, among the 10-bit pseudo random bit sequence signals PRBS [9:0] that are input to the memory cell row picking circuit 500, the case where PRBS [4:0] all match as "11111" may vary per row hammer monitoring time interval. For example, among the 10-bit pseudo random bit sequence signals PRBS [9:0] that are input to the memory cell row picking circuit 500, the case where PRBS [4:0] all match as "11111" may be once per 28 acts. In other examples, the case where PRBS [4:0] all match as "11111" may be once per 30 acts, once per 32 acts, once per 34 acts, or once per 35 acts. The average of the number of times of the row hammer attacks that occur when the memory cell row picking circuit 500 selects one memory cell row for each row hammer monitoring time interval may correspond to the cycle T1 of the memory cell row picking circuit 500.

In this way, the cycle T1 at which the memory cell row picking circuit 500 selects one memory cell row among the plurality of memory cell rows of the memory cell array 110 is determined on the basis of the pseudo random bit sequence signals PRBS1 that is output from the random number generator 141 implemented as the linear feedback shift register 400 (shown in FIG. 4), the memory cell row picking circuit 500 may randomly select the target row.

Next, referring to FIG. 6, memory cell row picking circuit 500A may include a logic gate G2 and an inverter INV2. Like the memory cell row picking circuit 500, the memory cell row picking circuit 500A may receive a 10-bit pseudo random bit sequence signal PRBS [9:0] that is output from the random number generator 141 (shown in FIG. 3). The logic gate G2 of the memory cell row picking circuit 500A may receive input of specific bits among the 10-bit pseudo random bit sequence signals PRBS [9:0] that are output from the random number generator 141.

The number of bits that are input to the logic gate G2 of the memory cell row picking circuit 500A may be different from the number of bits that are input to the logic gate G1 of the memory cell row picking circuit 500. For example, as shown in FIG. 5, the logic gate G1 of the memory cell row picking circuit 500 may receive five bits, but the logic gate G2 of the memory cell row picking circuit 500A may receive six bits.

For example, as shown in FIG. 6, the logic gate G2 may receive input of PRBS [1], PRBS [2], PRBS [5], PRBS [6], PRBS [7] and PRBS [8] among the 10-bit pseudo random bit sequence signals PRBS [9:0]. The logic gate G2 may perform the NAND computation on the input signal and then output the result thereof as signal $S_2$. When the input signals PRBS [1], PRBS [2], PRBS [5], PRBS [6], PRBS [7], and PRBS [8] are all "1", the logic gate G2 may output the logic low signal $S_2$.

The logic low signal $S_1$ is input to the inverter INV2, and may output the logic high picking signal Pick2. The picking signal Pick2 that is output from the inverter INV2 may correspond to the picking signal Pick2 that is output from the memory cell row picking circuit 142B of FIG. 3. The memory cell row picking circuit 500A may select one memory cell row among the plurality of memory cell rows of the memory cell array 110 (shown in FIG. 1) each time the memory cell row picking circuit 500A outputs the logic high picking signal Pick2.

In this way, the cycle at which the memory cell row picking circuit 500A outputs the logic high picking signal Pick2, that is, the cycle T2 at which the memory cell row picking circuit 500A selects one of the plurality of memory cell rows of the memory cell array 110, may be determined as a cycle of 64 TRC, that is, once every 64 acts on average, according to the above Equation 2. That is, the memory cell row picking circuit 500A may select one target row when there are 64 row hammer attacks during the row hammer monitoring time interval of the control logic circuit 130 (shown in FIG. 1).

In this way, since the cycle T2 at which the memory cell row picking circuit 500A selects one memory cell row among the plurality of memory cell rows of the memory cell array 110 is determined on the basis of the pseudo random bit sequence signal PRBS1 that is output from the random number generator 141 (shown in FIG. 3) implemented as the linear feedback shift register 400 (shown in FIG. 4), the memory cell row picking circuit 500A may randomly select the target row.

Furthermore, both the memory cell row picking circuit 500 and the memory cell row picking circuit 500A receive the same n-bit pseudo random bit sequence signal PRBS1 from the random number generator 141, but may select the target row at different cycles from each other, depending on the number of specific bits that are input to each of the included logic gates G1 and G2.

In FIGS. 5 and 6, although an example is described in which PRBS [0], PRBS [1], PRBS [2], PRBS [3], and PRBS [4] match, or in which PRBS [1], PRBS [2], PRBS [5], PRBS [6], PRBS [7], and PRBS [8] match, among the 10-bit pseudo random bit sequence signals PRBS [9:0], as an example, an embodiment regarding the specific bits that are to be matched among the ten bits of the pseudo random bit sequence signal PRBS [9:0] is not limited to the specific bits given as an example. That is, the type and number of specific bits that are to be matched in order for the memory cell row picking circuit 500 or the memory cell row picking circuit 500A to output the logic high picking signal Pick1 or the logic high picking signal Pick2 may vary according to embodiments.

According to embodiments, the memory cell row picking circuits 500 and 500A may each receive two or more specific bits of the 10-bit pseudo random bit sequence signal PRBS [9:0], and may output the logic high picking signal Pick1 or picking signal Pick2 and select one target row, in response to all of the specific bits matching as "1".

Further, although FIGS. 5 and 6 describe a case in which all of the bits input to the logic gates G1 and G2 match as "1", embodiments are not limited thereto.

For example, referring to FIG. 7, memory cell row picking circuit 500B may include a logic gate G3 and an inverter INV3. The memory cell row picking circuit 500B may receive the 10-bit pseudo random bit sequence signal PRBS [9:0] that is output from the random number generator 141 (shown in FIG. 3), and the logic gate G3 of the memory cell row picking circuit 500B may receive specific bits among the 10-bit pseudo random bit sequence signal PRBS [9:0] that is output from the random number generator 141. For example, as shown in FIG. 7, the logic gate G3 may receive input of PRBS [0], PRBS [7], PRBS [8], and PRBS [9] among the 10-bit pseudo random bit sequence signal PRBS [9:0]. The logic gate G3 may perform an OR computation on the input signal, and output the result as a signal $S_3$. The logic gate G3 may output the logic low signal $S_3$ when the input signals PRBS [0], PRBS [7], PRBS [8], and PRBS [9] are all "0".

The logic low signal $S_3$ is input to the inverter INV3, and may output the logic high picking signal Pick3. The memory cell row picking circuit 500B may select one memory cell row among the plurality of memory cell rows of the memory cell array 110 (shown in FIG. 1) each time the memory cell row picking circuit 500B outputs the logic high picking signal Pick3.

In this way, the cycle at which the memory cell row picking circuit 500B outputs the logic high picking signal Pick3, that is, the cycle T3 at which the memory cell row picking circuit 500B selects one of the plurality of memory cell rows of the memory cell array 110, may be determined as a cycle of 16 TRC, that is, once every 16 acts on average, according to the above Equation 2. That is, the memory cell row picking circuit 500B may select one target row each time there are sixteen row hammer attacks during the row hammer monitoring time interval of the control logic circuit 130 (shown in FIG. 1).

In this way, the memory cell row picking circuit may randomly select one memory cell row among the plurality of memory cell rows of the memory cell array 110 at an average cycle in response to the fact that specific two or more bits among the pseudo random bit sequence signals received from the random number generator match each other as "0" or "1", and store the row address of the selected target row in the assigned queue.

Figure 8:
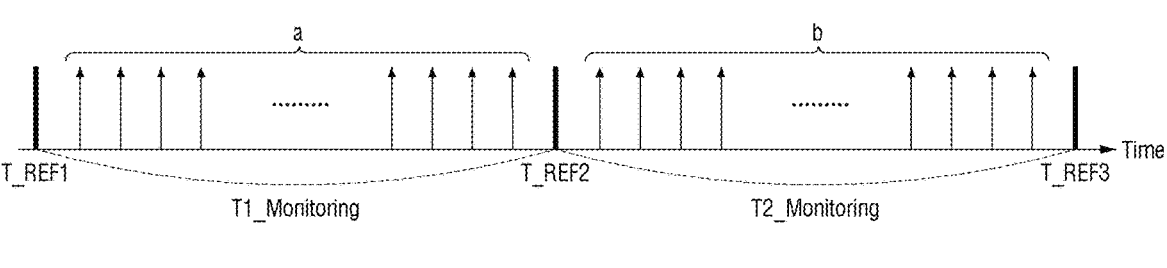
FIG. 8 is an example diagram for describing the effect of the row hammer control circuit of FIG. 3.

FIG. 8 is an example diagram for describing the effect of the row hammer control circuit of FIG. 3.

FIG. 8 is a timing diagram showing a refresh operation of the memory device 100 of FIG. 2. Referring to FIG. 8, the refresh operation may be performed on the memory cell rows physically adjacent to the memory cell row subjected to the row hammer attack, among the plurality of memory cell rows of the memory cell array 110 (shown in FIG. 2), at time T_REF1, time T_REF2, and time T_REF3, respectively.

A time interval T1_Monitoring between the time T_REF1 and the time T_REF2, and a time interval T2_Monitoring between the time T_REF2 and the time T_REF3, e.g., the time interval between the times at which row hammer care occurs, may correspond to the row hammer monitoring time interval of the control logic circuit 130 (shown in FIG. 2). An a-times row hammer attack may occur on the memory device 100 during the row hammer monitoring time interval T1_Monitoring. Furthermore, after the row hammer monitoring time interval T1_Monitoring, a b-times row hammer attack may occur during the row hammer monitoring time interval T2_Monitoring, which is the next row hammer monitoring time interval (here, a and b are 2 or more integers different from each other). In this way, the number of times of row hammer attacks that occur in the memory device 100 may vary for each row hammer monitoring time interval.

On the other hand, if the a-times row hammer attack occurs during the row hammer monitoring time interval T1_Monitoring, the memory cell row picking circuit may select the memory cell row with a probability of 1/a, and row hammer care is performed on the selected memory cell row at time T_REF2. That is, the defense power of the memory device 100 may be strengthened by uniformly performing row hammer care against the row hammer attacks that occur on the memory device 100 during the row hammer monitoring time interval T1_Monitoring.

For example, when 50 row hammer attacks occur during the row hammer monitoring time interval, in a case in which the memory cell row is not selected at a cycle of 50 TRC (e.g., select one target row when there are approximately 50 row hammer attacks during the row hammer monitoring time interval), the memory cell row is selected at a cycle of 30 TRC (e.g., one target row is selected when there are approximately 30 row hammer attacks during the row hammer monitoring time interval), and row hammer care is performed on the selected memory cell rows (since some of the selected memory cell rows are not input to the queue, they are not subjected to row hammer care at that cycle, but may be subjected to row hammer care at the next cycle). In this way, if the phenomenon of selecting the memory cell rows more frequently than the number of times of row hammer attacks that occurred during the row hammer monitoring time interval is repeated, a defense power of the memory device 100 against the row hammer attacks may deteriorate.

On the other hand, when 50 row hammer attacks occur during the row hammer monitoring time interval, in a case in which the memory cell row is selected at a cycle of 70 TRC (e.g., when there are approximately 70 row hammer attacks during the row hammer monitoring time interval, one target row is selected), and row hammer care is performed on the selected memory cell row, since the probability that the memory cell row is selected is low, when row hammer care is performed at time T_REF, there may be a high probability that the queue is empty (e.g., the memory cell row is empty in the queue.). As a result, the efficiency of row hammer care of the memory device 100 may be lowered, and the defense power of the memory device 100 against the row hammer attacks may deteriorate.

Furthermore, as shown in FIG. 8, since the number of times of row hammer attacks that occur on the memory device 100 during the row hammer monitoring time interval may vary for each row hammer monitoring time interval, when selecting the memory cell row as the memory cell row picking circuit selects having one fixed average cycle, and performing row hammer care, the defense power of the memory device 100 may deteriorate.

Therefore, in some embodiments, the row addresses of the memory cell rows selected by each memory cell row picking circuit are stored in the queue assigned to each memory cell row picking circuit, using two or more memory cell row picking circuits that select the memory cell rows at different cycles, and row hammer care is performed on the memory cell rows corresponding to the row addresses stored in each queue. Accordingly, the randomness of row hammer care can be strengthened, and the defense power of the memory device 100 against the row hammer attacks can be strengthened.

Furthermore, since the memory cell row picking circuit selects the memory cell row at an average cycle on the basis of the pseudo random bit sequence signal received from the random number generator, it is possible to further enhance the randomness of row hammer care on the memory device 100.

FIG. 9 is an example diagram showing a configuration of the row hammer control circuit according to some embodiments. Hereinafter, for convenience of explanation, a further description of elements and technical aspects previously described may be omitted, and differences from embodiments described above will be mainly described.

Referring to FIG. 9, a row hammer control circuit 140A may include a random number generator 141A, a random number generator 141B, a memory cell row picking circuit 142C, and a memory cell row picking circuit 142D. The random number generator 141A may operate as the enable signal RNG2_EN is applied, and the random number generator 141B may operate as the enable signal RNG3_EN is applied. Each of the random number generator 141A and the random number generator 141B may also be referred to as a random number generator circuit.

The random number generator 141A may be implemented as a linear feedback shift register that generates a k-bit pseudo random bit sequence signal PRBS2 on the basis of a second seed and a second degree, and the random number generator 141B may be implemented as a linear feedback shift register that generates a j-bit pseudo random bit sequence signal on the basis of a third seed and a third degree (here, k and j are integers of 2 or more).

In some embodiments, the second seed and the third seed may be different from each other, or the second degree and the third degree may be different from each other. That is, when the random number generator 141A and the random number generator 141B are each implemented as the linear feedback shift register 400 of FIG. 4, both the seeds and degrees of the random number generators 141A and 141B may be different from each other, the random number generators 141A and 141B may have the same seeds and different degrees, or the random number generators 141A and 141B may have the same degrees and different seeds. In this way, the row hammer control circuit 140 may include two or more random number generators that differ from each other in at least one of seeds and degrees.

The memory cell row picking circuit 142C may operate as the enable signal RPC3_EN is applied. The memory cell row picking circuit 142C may receive the k-bit pseudo random bit sequence signal PRBS2 from the random number generator 141A. When the enable signal RPC3_EN is applied to the memory cell row picking circuit 142C, the memory cell row picking circuit 142C may randomly select one of the plurality of memory cell rows (e.g., a target row) of the memory cell array 110 (shown in FIG. 2) on the basis of the received k-bit pseudo random bit sequence signal PRBS2. At this time, the memory cell row selected by the memory cell row picking circuit 142C may be the target row that is intensively accessed during the row hammer monitoring time interval of the control logic circuit 130 (shown in FIG.

1), that is, the memory cell row subjected to the row hammer attack. Further, the memory cell row picking circuit 142C may select the memory cell rows one by one at a cycle T4.

When the memory cell row picking circuit 142C selects one memory cell row at the cycle T4, the memory cell row picking circuit 142C may output a logic high picking signal Pick3. On the basis of the logic high picking signal Pick3, the memory cell row picking circuit 142C may store the row address of the selected memory cell row in the queue Q3. At this time, the queue Q3 may be exclusively assigned to the memory cell row picking circuit 142C. The row addresses stored in the queue Q3 may be provided to the refresh control circuit 150 (shown in FIG. 2) as a row hammer address RH_ADDR of FIG. 2.

The memory cell row picking circuit 142D may operate as the enable signal RPC4_EN is applied. The memory cell row picking circuit 142D may receive a j-bit pseudo random bit sequence signal PRBS3 from the random number generator 141B. When the enable signal RPC4_EN is applied to the memory cell row picking circuit 142D, the memory cell row picking circuit 142D may randomly select one memory cell row (e.g., the target row) among the plurality of memory cell rows of the memory cell array 110 on the basis of the received j-bit pseudo random bit sequence signal PRBS3. At this time, the memory cell row selected by the memory cell row picking circuit 142D may be a target row that is intensively accessed during the row hammer monitoring time interval of the control logic circuit 130, that is, a memory cell row that is subjected to the row hammer attack. At this time, the memory cell row picking circuit 142D may select the memory cell rows one by one at a cycle T5 that is different from the cycle T4 of the memory cell row picking circuit 142C.

When the memory cell row picking circuit 142D selects one memory cell row at the cycle T5, the memory cell row picking circuit 142D may output a logic high picking signal Pick4. On the basis of the logic high picking signal Pick 4, the memory cell row picking circuit 142D may store the row address of the selected memory cell row in the queue Q4. At this time, the queue Q4 may be exclusively assigned to the memory cell row picking circuit 142D. The row addresses stored in the queue Q4 may be provided to the refresh control circuit 150 as the row hammer address RH_ADDR of FIG. 2.

In this way, the row hammer control circuit 140A may include two or more random number generators 141A and 141B that differ in at least one of seeds and degrees, and the memory cell row picking circuits 142C and 142D that have received the pseudo random bit sequence signals PRBS2 and PRBS3 from each of the random number generators 141A and 141B may select memory cell rows at different cycles, and store the row addresses of the selected memory cell rows in the queues Q3 and Q4 assigned to each of them, respectively.

Although FIG. 8 shows that the random number generator 141A sends the pseudo random bit sequence signal PRBS2 to one memory cell row picking circuit 142C, and the random number generator 141B sends the pseudo random bit sequence signal PRBS3 to one memory cell row picking circuit 142D, embodiments are not limited thereto. For example, in some embodiments, the random number generator 141A or the random number generator 141B may each send the pseudo random bit sequence signal to two or more memory cell row picking circuits, and each memory cell row picking circuit may select the memory cell row at different cycles from each other, and store the row address of the selected memory cell row in the queue assigned to each of them.

Figure 10:
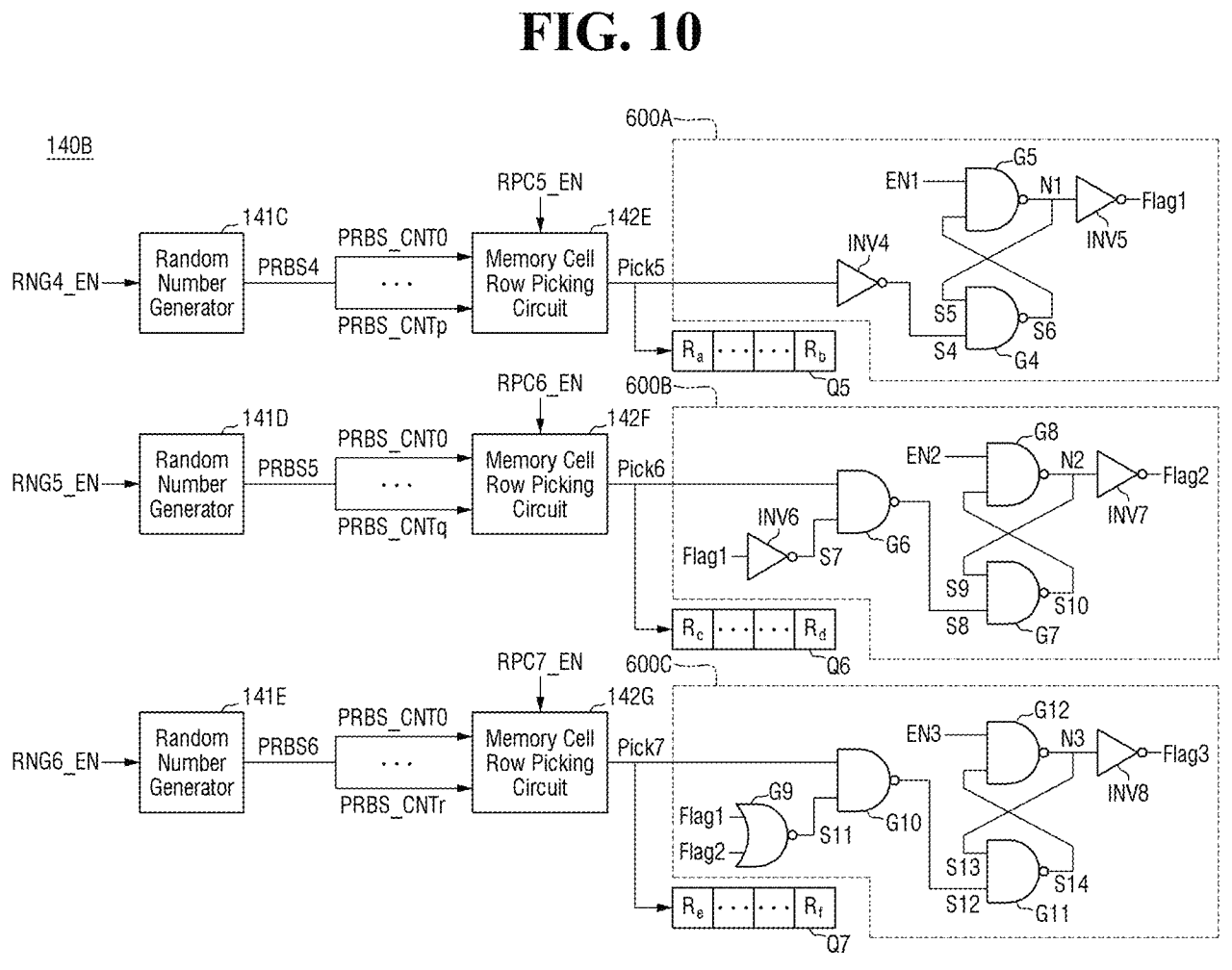

FIG. 10 is an example diagram showing a configuration of a flag signal generation circuit according to some embodiments. Hereinafter, for convenience of explanation, a further description of elements and technical aspects previously described may be omitted, and differences from embodiments described above will be mainly described.

Referring to FIG. 10, the row hammer control circuit 140B may include random number generators 141C, 141D, and 141E that operate according to each of the enable signals RNG4_EN, RNG5_EN, and RNG6_EN, and memory cell row picking circuits 142E, 142F, and 142G that operate according to each of the enable signals RPC5_EN, RPC6_EN, and RPC7_EN. Each of the random number generators 141C, 141D, and 141E may output p-bit, q-bit, and r-bit pseudo random bit sequence signals PRBS4, PRBS5, and PRBS6, and send the signals to the memory cell row picking circuits 142E, 142F, and 142G, (here, p, q, and r are integers of 2 or more). Each of the random number generators 141C, 141D, and 141E may also be referred to as a random number generator circuit.

The memory cell row picking circuits 142E, 142F, and 142G may select the memory cell rows (that is, target rows) at different cycles from each other on the basis of the received signals, and output the picking signals Pick5, Pick6, and Pick7. Each of the memory cell row picking circuits 142E, 142F, and 142G may store the row address of one memory cell row selected in the queues Q5, Q6, and Q7, when the picking signals Pick5, Pick6, and Pick7 are logic high.

In some embodiments, the row hammer control circuit 140B may further include a flag signal generation circuit 600A, a flag signal generation circuit 600B, and a flag signal generation circuit 600C.

The flag signal generation circuit 600A may output a flag signal Flag1 on the basis of the picking signal Pick5 that is output from the memory cell row picking circuit 142E. The flag signal generation circuit 600B may output a flag signal Flag2 on the basis of the picking signal Pick6 output from the memory cell row picking circuit 142F and the flag signal Flag1. The flag signal generation circuit 600C may output a flag signal Flag3 on the basis of the picking signal Pick7 output from the memory cell row picking circuit 142G, the flag signal Flag1, and the flag signal Flag2.

In some embodiments, the flag signals Flag1, Flag2, and Flag3 that are output from each of the flag signal generation circuits 600A, 600B, and 600C of the row hammer control circuit 140B may be sent to the refresh control circuit 150 (shown in FIG. 2). The refresh control circuit 150 may define the order of row hammer care on the memory cell rows corresponding to the row addresses each stored in the queues Q5, Q6, and Q7, on the basis of the flag signals Flag1, Flag2, and Flag3. For example, when the flag signal Flag1 is logic high and the flag signals Flag2 and Flag3 are logic low, the refresh control circuit 150 may perform the refresh operation on the memory cell rows physically adjacent to the memory cell rows corresponding to the row addresses stored in the queue Q5, e.g., the row hammer care operation, in preference to the row hammer care operation on the memory cell rows corresponding to the row addresses stored in the queue Q6 and the queue Q7, respectively.

That is, only when there is no row address stored in the queue Q5 is the row hammer care operation performed on the memory cell rows corresponding to the row addresses stored in the queue Q6 or the queue Q7, respectively. When the row address is stored in the queue Q5, the row hammer care operation may be performed at first on the memory cell row corresponding to the row address stored in the queue Q5.

However, embodiments are not limited thereto. For example, according to embodiments, the row hammer control circuit 140B does not send the flag signals to the refresh control circuit 150, but may determine priority of each of the queues Q5, Q6, and Q7 depending on the logic state of each of the flag signals Flag1, Flag2, and Flag3, and provide the row address stored in any one queue to the refresh control circuit 150 as the row hammer address RH_ADDR.

For example, in an embodiment, when the flag signal Flag1 is logic high and the flag signals Flag2 and Flag3 are logic low, the row hammer control circuit 140B may provide the row address stored in the queue Q5 to the refresh control circuit 150 as the row hammer address RH_ADDR, and the row addresses stored in the queues Q6 and Q7 is not provided to the refresh control circuit 150.

In an embodiment, when the flag signal Flag1 and the flag signal Flag3 are logic low and the flag signal Flag2 is logic high, the row hammer control circuit 140B may provide the row address stored in the queue Q6 to the refresh control circuit 150 as the row hammer address RH_ADDR, and does not provide the row addresses stored in each of the queues Q5 and Q7 to the refresh control circuit 150.

In an embodiment, when the flag signal Flag1 and the flag signal Flag2 are logic low and the flag signal Flag3 is logic high, the row hammer control circuit 140B may provide only the row address stored in the queue Q7 to the refresh control circuit 150 as the row hammer address RH_ADDR.

In this way, the refresh control circuit 150 may perform row hammer care operation on the memory cell rows corresponding to the row address stored in any one of the queues Q5, Q6, and Q7, depending on the logic states of the flag signals Flag1, Flag2, and Flag3, in preference to the row hammer care operation on the memory cell rows corresponding to the row addresses stored in other queues. That is, the row hammer care operation on the row address stored in the queue corresponding to the memory cell row picking circuit whose flag signal is logic high may be performed, in preference to the row hammer care operation on the row addresses stored in the queue corresponding to the memory cell row picking circuit whose flag signal is logic low.

In some embodiments, row hammer care operation on the row address stored in the queue corresponding to the memory cell row picking circuit having a relatively long cycle may be performed, in preference to the row hammer care operation on the row address stored in the queue corresponding to the memory cell row picking circuit having a relatively short cycle.

For example, assuming that the memory cell row picking circuit 142E selects the single memory cell row at a cycle T6, the memory cell row picking circuit 142F selects the single memory cell row at cycle T7, and the memory cell row picking circuit 142G selects the single memory cell row at a cycle T8 (here, assuming that the cycle T6 is longer than the cycle T7, and the cycle T7 is longer than the cycle T8), the row hammer care operation on the row address stored in the queue Q5 may be performed in preference to the row hammer care operation on the row address stored in the queue Q6, and the row hammer care operation on the row address stored in the queue Q6 may be performed in preference to the row hammer care operation on the row address stored in the queue Q7.

For example, assuming that the memory cell row picking circuit 142E selects one target row when there are 200 row hammer attacks, the memory cell row picking circuit 142F selects one target row when there are 150 row hammer attacks, and the memory cell row picking circuit 142G selects one target row when there are 100 row hammer attacks, the row hammer care operation on the row address stored in the queue Q5 may be performed in preference to the row hammer care operation on the row address stored in the queue Q6, and the row hammer care operation on the row address stored in the queue Q6 may be performed in preference to the row hammer care operation on the row address stored in the queue Q7.

Therefore, each circuit configuration of the flag signal generation circuits 600A, 600B, and 600C may be configured such that when the flag signal Flag1 is logic high, the flag signals Flag2 and Flag3 are logic low, when the flag signals Flag1 and Flag 3 are logic low, the flag signal Flag2 is logic high, and when the flag signals Flag1 and Flag2 are logic low, the flag signal Flag3 is logic high.

In some embodiments, the flag signal generation circuit 600A may include an inverter INV4, an inverter INV5, a logic gate G4, and a logic gate G5.

First, a case in which each of the memory cell row picking circuits 142E, 142F, and 142G selects one memory cell row, that is, a case in which the picking signals Pick5, Pick6, and Pick7 are all logic high, will be described as an example. The logic high picking signal Pick5 may be input to the inverter INV4. The inverter INV4 may invert the logic high picking signal Pick5 and output a logic low signal S4. The logic low signal S4 and the signal S5 of the node N1 may be input to the logic gate G4. The logic gate G1 may perform the NAND computation on the logic low signal S4 and the signal S5 to output a signal S6. At this time, the signal S6 may be logic high.

The enable signal EN1 and the logic high signal S6 may be input to the logic gate G5. When the picking signal Pick5 that is output from the memory cell row picking circuit 142E is logic high, the enable signal EN1 which is input to the logic gate G5 may be logic high. The logic gate G5 may perform the NAND computation on the logic high enable signal EN1 and the logic high signal S6 to provide the logic low signal S5 to the node N1. The inverter INV5 may invert the logic low signal S5 and output the logic high flag signal Flag1.

In some embodiments, the flag signal generation circuit 600B may output the flag signal Flag2, on the basis of the picking signal Pick6 and the flag signal Flag1 that are output from the memory cell row picking circuit 142F. The flag signal generation circuit 600B may include an inverter INV6, an inverter INV7, a logic gate G6, a logic gate G7, and a logic gate G8.

The logic high flag signal Flag1 may be input to the inverter INV6 of the flag signal generation circuit 600B. The inverter INV6 may invert the logic high flag signal Flag1 to output a logic low signal S7. The logic low signal S7 and the logic high picking signal Pick6 may be input to the logic gate G6. The logic gate G6 may perform the NAND computation on the logic low signal S7 and the logic high picking signal Pick6, and output a logic high signal S8.

The logic high signal S8 and a signal S9 of the node N2 may be input to the logic gate G7. The logic gate G7 may perform the NAND computation on the logic high signal S8 and the signal S9 to output a signal S10. An enable signal EN2 and the signal S10 may be input to the logic gate G8. At this time, when the flag signal Flag1 is logic high, the enable signal EN2 that is input to the logic gate G8 may be logic low. The logic gate G8 may perform the NAND computation on the logic low enable signal EN2 and the signal S10 to provide the logic high signal S9 to the node N2. The inverter INV7 may invert the logic high signal S9 to output the logic low flag signal Flag2.

In some embodiments, the flag signal generation circuit 600C may output the flag signal Flag3, on the basis of the picking signal Pick7, the flag signal Flag1, and the flag signal Flag2 that are output from the memory cell row picking circuit 142G. The flag signal generation circuit 600C may include a logic gate G9, a logic gate G10, a logic gate G11, a logic gate G12, and an inverter INV8.

The logic high flag signal Flag1 and the logic low flag signal Flag2 may be input to the logic gate G9. The logic gate G9 may perform a NOR computation on the logic high flag signal Flag1 and the logic low flag signal Flag2, and output a logic low signal S11. The logic low signal S11 and the logic high picking signal Pick7 may be input to the logic gate G10. The logic gate G10 may perform the NAND computation on the logic low signal S11 and the logic high picking signal Pick7 to output a logic high signal S12.

A signal S13 of the node N3 connected to the output terminal of the logic gate G12 may be input to the logic gate G11. The logic gate G11 may perform the NAND computation on the logic high signal S12 and the signal S13 to output a signal S14. An enable signal EN3 and the signal S14 may be input to the logic gate G12. When the flag signal Flag1 or the flag signal Flag2 is logic high, the enable signal EN3 input to the logic gate G12 may be logic low. The logic gate G12 may perform the NAND computation on the logic low enable signal EN3 and the signal S14 to provide the logic high signal S13 to the node N3. The inverter INV8 may invert the logic high signal S13 and output the logic low flag signal Flag3.

In this way, when the flag signal Flag1 is logic high, each of the flag signals Flag2 and Flag3 is logic low, and the row hammer care operation on the row address stored in the queue Q5 corresponding to the memory cell row picking circuit 142E having the longest cycle may be performed in preference to the row hammer care operations on the row addresses stored in the queues Q6 and Q7 corresponding to each of other memory cell row picking circuits 142F and 142G.

Next, an example will be described by a case in which when the memory cell row picking circuit 142E does not select the memory cell row, and the memory cell row picking circuits 142F and 142G each select one memory cell row, that is, the picking signal Pick5 is logic low, and the picking signal Pick6 and Pick7 are logic high. Hereinafter, for convenience of explanation, a further description of elements and technical aspects previously described may be omitted, and differences from embodiments described above will be mainly described.

The logic low picking signal Pick5 may be input to the inverter INV4. The inverter INV4 may invert the logic low picking signal Pick5 to output a logic high signal S4. The logic high signal S4 and the signal S5 of the node N1 may be input to the logic gate G4. The logic gate G4 may perform the NAND computation on the logic high signal S4 and the signal S5 to output a signal S6.

The enable signal EN1 and the signal S6 may be input to the logic gate G5. When the picking signal Pick5 that is output from the memory cell row picking circuit 142E is logic low, the enable signal EN1 that is input to the logic gate G5 may be logic low. The logic gate G5 may perform the NAND computation on the logic low enable signal EN1 and the signal S6 to provide the logic high signal S5 to the node N1. The inverter INV5 may invert the logic high signal S5 to output the logic low flag signal Flag1.

The logic low flag signal Flag1 may be input to the inverter INV6 of the flag signal generation circuit 600B. The inverter INV6 may invert the logic low flag signal Flag1 to output a logic high signal S7. The logic high signal S7 and the logic high picking signal Pick6 may be input to the logic gate 61. The logic gate G6 may perform the NAND computation on the logic high signal S7 and the logic high picking signal Pick6, and output a logic low signal S8. The logic low signal S8 and the signal S9 of the node N2 may be input to the logic gate G7. The logic gate G7 may perform the NAND computation on the logic low signal S8 and the signal S9 to output a logic high signal S10.

The enable signal EN2 and the logic high signal S10 may be input to the logic gate G8. If the flag signal Flag1 is logic low and the picking signal Pick6 is logic high, the enable signal EN2 that is input to the logic gate G8 may be logic high. The logic gate G8 may perform the NAND computation on the logic high enable signal EN2 and the logic high signal S10 to provide the logic low signal S9 to the node N2. The inverter INV7 may invert the logic low signal S9 to output the logic high flag signal Flag2.

The logic low flag signal Flag1 and the logic high flag signal Flag2 may be input to the logic gate G9 of the flag signal generation circuit 600C. The logic gate G9 may perform a NOR computation on the logic low flag signal Flag1 and the logic high flag signal Flag2, and output a logic low signal S11. The logic low signal S11 and the logic high picking signal Pick7 may be input to the logic gate G10. The logic gate G10 may perform the NAND computation on the logic low signal S11 and the logic high picking signal Pick7, and output a logic high signal S12.

The signal S13 of the node N3 connected to the output terminal of the logic gate G12 may be input to the logic gate G11. The logic gate G11 may perform the NAND computation on the logic high signal S12 and the signal S13 to output a signal S14. The enable signal EN3 and the signal S14 may be input to the logic gate G12. When the flag signal Flag1 or the flag signal Flag2 is logic high, the enable signal EN3 that is input to the logic gate G12 may be logic low. The logic gate G12 may perform the NAND computation on the logic low enable signal EN3 and the signal S14 to provide the logic high signal S13 to the node N3. The inverter INV8 may invert the logic high signal S13 to output the logic low flag signal Flag3.

In this way, when the flag signal Flag1 is logic low and the picking signal Pick6 is logic high, the flag signal Flag2 may become logic high, and the flag signal Flag3 may become logic low. As a result, when the memory cell row picking circuit 142E having the longest cycle does not select the memory cell row, the row hammer care operation on the row address stored in the queue Q6 corresponding to the memory cell row picking circuit 142F with the next longest cycle may be performed in preference to the row hammer care operation on the row addresses stored in the queue Q7 corresponding to the other memory cell row picking circuit 142G.

Next, an example will be described by a case in which the memory cell row picking circuits 142E and 142F do not select the memory cell row and the memory cell row picking circuit 142G selects one memory cell row, that is, the picking signals Pick5 and Pick6 are logic low, and the picking signal Pick7 is logic high.

The logic low picking signal Pick5 may be input to the inverter INV4. The inverter INV4 may invert the logic low picking signal Pick5 to output a logic high signal S4. The logic high signal S4 and the signal S5 of the node N1 may be input to the logic gate G4. The logic gate G4 may perform the NAND computation on the logic high signal S4 and the signal S5 to output a signal S6.

The enable signal EN1 and the signal S6 may be input to the logic gate G5. When the picking signal Pick5 that is output from the memory cell row picking circuit 142E is logic low, the enable signal EN1 that is input to the logic gate G5 may be logic low. The logic gate G5 may perform the NAND computation on the logic low enable signal EN1 and the signal S6 to provide the logic high signal S5 to the node N1. The inverter INV5 may invert the logic high signal S5 to output the logic low flag signal Flag1.

The logic low flag signal Flag1 may be input to the inverter INV6 of the flag signal generation circuit 600B. The inverter INV6 may invert the logic low flag signal Flag1 to output a logic high signal S7. The logic high signal S7 and the logic low picking signal Pick6 may be input to the logic gate G6. The logic gate G6 may perform the NAND computation on the logic high signal S7 and the logic low picking signal Pick6 to output a logic high signal S8. The logic high signal S8 and the signal S9 of the node N2 may be input to the logic gate G7. The logic gate G7 may perform the NAND computation on the logic high signal S8 and the signal S9 to output a signal S10.

The enable signal EN2 and the signal S10 may be input to the logic gate G8. When the picking signal Pick6 is logic low, the enable signal EN2 that is input to logic gate G8 may be logic low. The logic gate G8 may perform the NAND computation on the logic low enable signal EN2 and the signal S10 to provide the logic high signal S9 to the node N2. The inverter INV7 may invert the logic high signal S9 to output the logic low flag signal Flag2.

The logic low flag signal Flag1 and the logic low flag signal Flag2 may be input to the logic gate G9 of the flag signal generation circuit 600C. The logic gate G9 may perform a NOR computation on the logic low flag signal Flag1 and the logic low flag signal Flag2, and output a logic high signal S11. The logic high signal S11 and the logic high picking signal Pick7 may be input to the logic gate G10. The logic gate G10 may perform the NAND computation on the logic high signal S11 and the logic high picking signal Pick7, and output the logic low signal S12.

The signal S13 of the node N3 connected to the output terminal of the logic gate G12 may be input to the logic gate G11. The logic gate G11 may perform the NAND computation on the logic low signal S12 and the signal S13, and output the logic high signal S14. The enable signal EN3 and the logic high signal S14 may be input to the logic gate G12. When the flag signals Flag1 and Flag2 are logic low and the picking signal Pick7 is logic high, the enable signal EN3 may be logic high. The logic gate G12 may perform the NAND computation on the logic high enable signal EN3 and the logic high signal S14, and provide the logic low signal S13 to the node N3. The inverter INV8 may invert the logic low signal S13 to output the logic high flag signal Flag3.

In this way, when the flag signals Flag1 and Flag2 are logic low and the picking signal Pick7 is logic high, the flag signal Flag3 may be logic high. Accordingly, when the memory cell row picking circuits 142E and 142F, which have a longer cycle than the memory cell row picking circuit 142G, do not select the memory cell row, the row hammer care operation on the row address stored in the queue Q7 corresponding to the memory cell row picking circuit 142G may be performed at first. Thereafter, when the flag signal Flag1 or the flag signal Flag2 becomes logic high, the row hammer care operation on the row address stored in the queue corresponding to the memory cell row picking circuit 142E and 142F having a long cycle may be performed, in preference to the row hammer care operation on the row address stored in the queue corresponding to the memory cell row picking circuit 142G.

Figure 11:
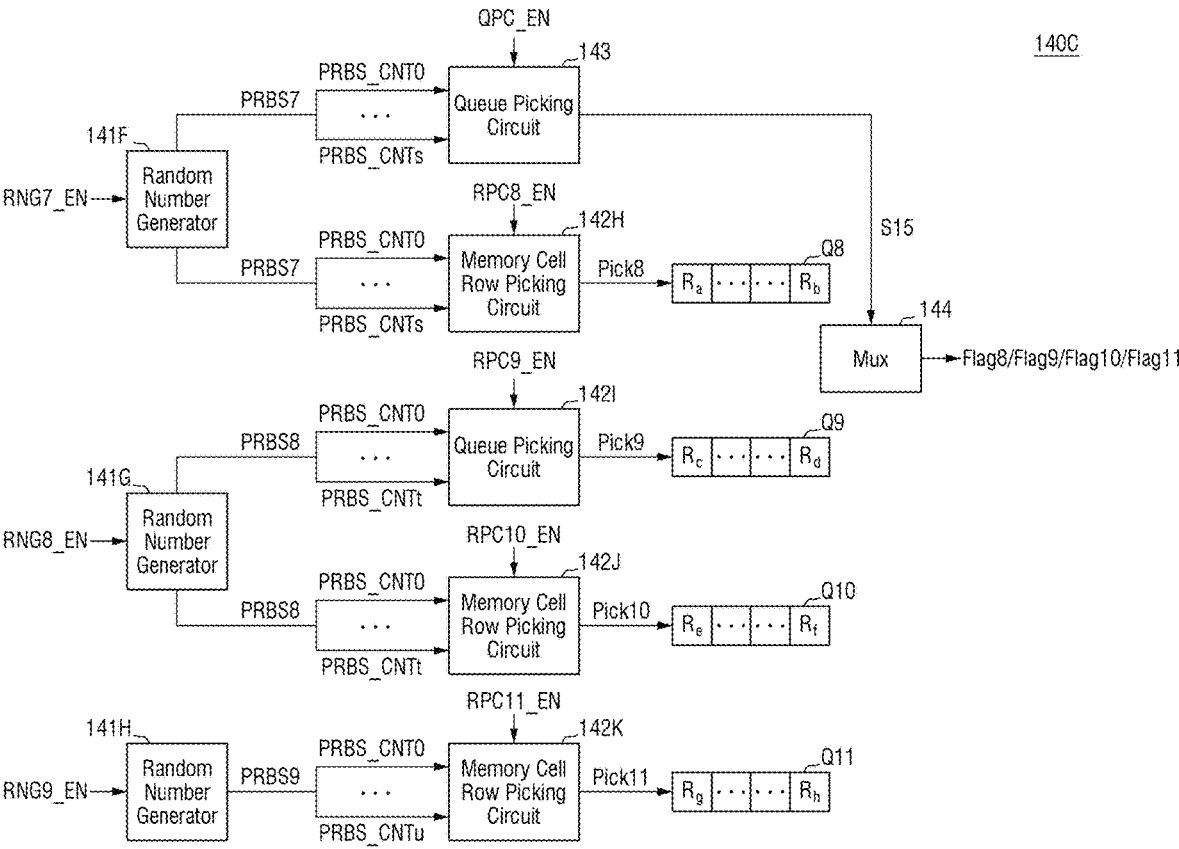
FIG. 11 is an example diagram showing a configuration of a flag signal generation circuit according to some embodiments.

FIG. 11 is an example diagram showing a configuration of a flag signal generation circuit according to some embodiments.

Referring to FIG. 11, the row hammer control circuit 140C may include random number generators 141F, 141G, and 141H that operate according to each of the enable signals RNG7_EN, RNG8_EN, and RNG9_EN, and memory cell row picking circuits 142H, 142I, 142J, and 142K that operate according to each of the enable signals RPC8_EN, RPC9_EN, RPC10_EN, and RPC11_EN. Each of the random number generators 141F, 141G, and 141H may output s-bit, t-bit, and u-bit pseudo random bit sequence signals PRBS7, PRBS8, and PRBS9, and send the signals to the memory cell row picking circuits 142H, 142I, 142J, and 142K. Each of the random number generators 141F, 141G, and 141H may also be referred to as a random number generator circuit.

The memory cell row picking circuits 142H, 142I, 142J, and 142K may select the memory cell rows at different cycles from each other on the basis of the received signals, and output the picking signals Pick8, Pick9, Pick10, and Pick11, respectively. Each of the memory cell row picking circuits 142H, 142I, 142J, and 142K may store the row address of the selected one memory cell row in each of the queues Q8, Q9, Q10, and Q11, when the picking signals Pick8, Pick9, Pick10, and Pick11 are logic high.

Although the row hammer control circuit 140C is shown in FIG. 11 to include three random number generators 141F, 141G, and 141H, and four memory cell row picking circuits 142H, 142I, 142J, and 142K, embodiments are not limited thereto. For example, the number of random number generators and memory cell row picking circuits included in the row hammer control circuit 140C may vary according to embodiments.

In some embodiments, the row hammer control circuit 140C may further include a queue picking circuit 143 and a multiplexer 144. The queue picking circuit 143 may receive the s-bit pseudo random bit sequence signal PRBS7 from the random number generator 141F together with the memory cell row picking circuit 142H. The queue picking circuit 143 may send a signal S15 including the first bit among the s-bit pseudo random bit sequence signal PRBS7 received from the random number generator 141F to the multiplexer 144. At this time, the number of bits of the first bit may be determined by the number of memory cell row picking circuits included in the row hammer control circuit 140C. For example, as shown in FIG. 11, when the number of memory cell row picking circuits included in the row hammer control circuit 140C is four, the queue picking circuit 143 may send the signal S15 including 2 bits among the s-bit pseudo random bit sequence signal PRBS7 received from the random number generator 141F to the multiplexer 144.

The multiplexer 144 may output any one of the flag signals Flag8, Flag9, Flag10, and Flag11 in response to the signal S15 received from the queue picking circuit 143. The flag signals Flag8, Flag9, Flag10, and Flag11 may correspond to the memory cell row picking circuits 142H, 142I, 142J, and 142K, respectively. Further, the flag signals Flag8, Flag9, Flag10, and Flag11 may correspond to the queues Q8, Q9, Q10, and Q11 exclusively assigned to the memory cell row picking circuits 142H, 142I, 142J, and 142K, respectively.

The row hammer control circuit 140C may provide the row address stored in the queue corresponding to the flag signal output from the multiplexer 144 to the refresh control circuit 150 (shown in FIG. 2) as the row hammer address RH_ADDR. For example, when the multiplexer 144 outputs the flag signal Flag8, the row hammer control circuit 140C may provide the row address at first among the row addresses stored in the queue Q8 to the refresh control circuit 150 as the row hammer address RH_ADDR.

In some embodiments, the signal S15 including the first bit may refer to any one of the memory cell row picking circuits 142H, 142I, 142J, and 142K included in the row hammer control circuit 140C. For example, assuming that the cycle at which the memory cell row picking circuit selects one memory cell row is long in the order of the memory cell row picking circuit 142H, the memory cell row picking circuit 142I, the memory cell row picking circuit 142J, and the memory cell row picking circuit 142K, when the signal S15 is "00", the multiplexer 144 may select the memory cell row picking circuit 142H and output the flag signal Flag8. Further, when the signal S15 is "01", the multiplexer 144 may select the memory cell row picking circuit 142I and output the flag signal Flag9, when the signal S15 is "10", the multiplexer 144 may select the memory cell row picking circuit 142J and output the flag signal Flag10, and when the signal S15 is "11", the multiplexer 144 may select the memory cell row picking circuit 142K and output the flag signal Flag11. However, embodiments are not limited thereto. For example, according to embodiments, the flag signal output from the multiplexer 144 according to the signal S15 including the first bit, and the memory cell row picking circuit corresponding thereto, may be determined randomly regardless of the cycle of the memory cell row picking circuit.

In this way, the order by which the row addresses stored in each of the queues Q8, Q9, Q10, and Q11 are provided to the refresh control circuit 150 as the row hammer address RH_ADDR may be randomly determined by a queue picking circuit that receives the pseudo random bit sequence signal from any one random number generator included in the row hammer control circuit 140C, and a multiplexer that outputs a flag signal in response to the bit signal output from the queue picking circuit.

Figure 12:
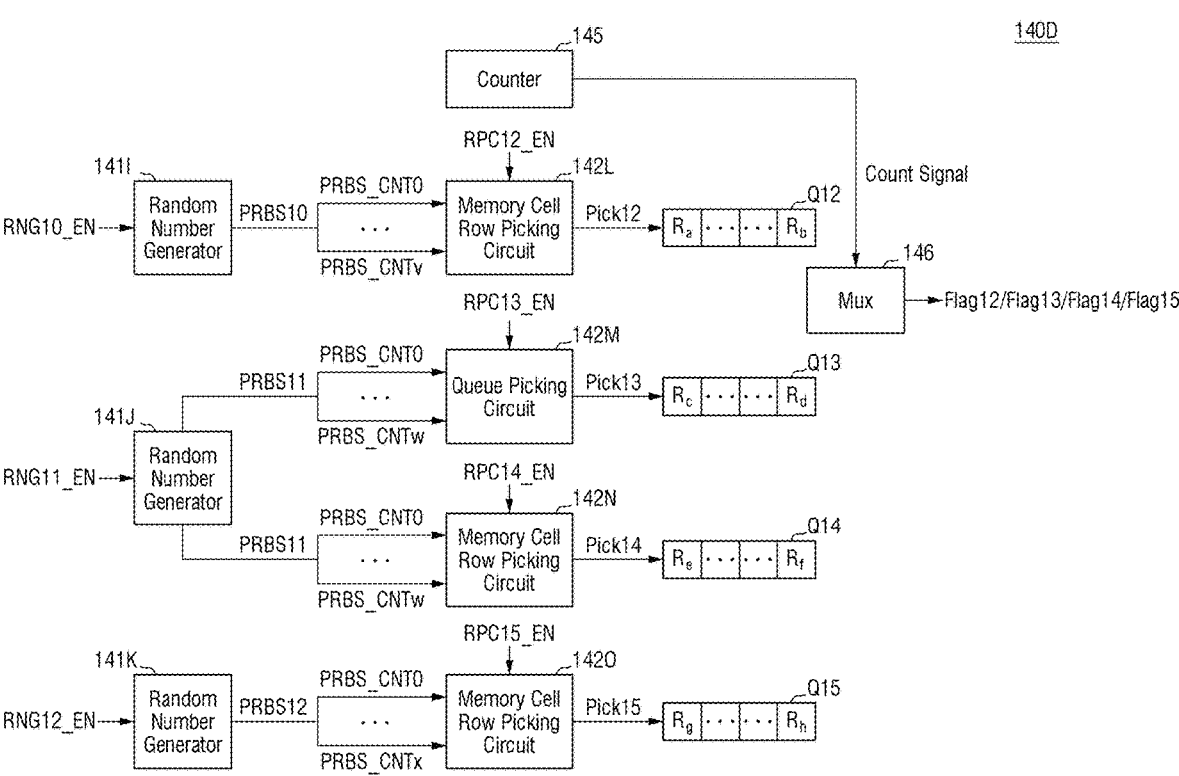
FIG. 12 is an example diagram showing a configuration of a flag signal generation circuit according to some embodiments.

FIG. 12 is an example diagram showing a configuration of a flag signal generation circuit according to some embodiments.

Referring to FIG. 12, a row hammer control circuit 140D may include random number generators 141I, 141J, and 141K that operate according to each of the enable signals RNG10_EN, RNG11_EN, and RNG12_EN, and memory cell row picking circuits 142L, 142M, 142N, and 1420 that operate according to each of the enable signals RPC12_EN, RPC13EN, RPC14_EN, and RPC15_EN. Each of the random number generators 141I, 141J, and 141K may output v-bit, w-bit, and x-bit pseudo random bit sequence signals, and send the signals to the memory cell row picking circuits 142L, 142M, 142N, and 1420, respectively (here, v, w, and x are each integers of 2 or more). Each of the random number generators 141I, 141J, and 141K may also be referred to as a random number generator circuit.

The memory cell row picking circuits 142L, 142M, 142N, and 1420 may select memory cell rows at different cycles on the basis of the received signals, and output picking signals Pick12, Pick13, Pick14, and Pick15, respectively. Each of the memory cell row picking circuits 142L, 142M, 142N, and 1420 may store the row addresses of one memory cell row selected by each of the queues Q12, Q13, Q14, and Q15, when the picking signals Pick12, Pick13, Pick14, and Pick15 are logic high.

Although the row hammer control circuit 140 is shown in FIG. 12 to include three random number generators 141I, 141J, and 141K and four memory cell row picking circuits 142L, 142M, 142N, and 142O, embodiments are not limited thereto. For example, the number of random number generators and memory cell row picking circuits included in the row hammer control circuit 140D, and the number of memory cell row picking circuits that receive the pseudo random bit sequence signals from one random number generator, may vary according to embodiments.

In some embodiments, the row hammer control circuit 140D may further include a counter 145 and a multiplexer 146. The counter 145 may also be referred to as a counter circuit. The counter 145 may send a count signal including the second bit to the multiplexer 146. The number of bits of the count signal may be determined by the number of memory cell row picking circuits included in the row hammer control circuit 140D. For example, as shown in FIG. 12, when the number of memory cell row picking circuits included in the row hammer control circuit 140D is four, the counter 145 may send a count signal including 2-bits to the multiplexer 146

The multiplexer 146 may output any one of the flag signals Flag12, Flag13, Flag14, and Flag15 in response to the count signal received from the counter 145. The flag signals Flag12, Flag13, Flag14, and Flag15 may correspond to the memory cell row picking circuits 142L, 142M, 142N, and 142O, respectively. Further, the flag signals Flag12, Flag13, Flag14, and Flag15 may correspond to the queues Q12, Q13, Q14, and Q15 that are exclusively assigned to the memory cell row picking circuits 142L, 142M, 142N, and 142O, respectively.

The row hammer control circuit 140D may provide the row address, which is stored in the queue corresponding to the flag signal output from the multiplexer 146, to the refresh control circuit 150 (shown in FIG. 2), as the row hammer address RH_ADDR. For example, when the multiplexer 146 outputs the flag signal Flag12, the row hammer control circuit 140D may provide the row address stored at first among the row addresses stored in the queue Q12 to the refresh control circuit 150 as the row hammer address RH_ADDR.

In some embodiments, the count signal including the second bit may refer to any one of the memory cell row picking circuits included in the row hammer control circuit 140D. For example, assuming that the cycle at which the memory cell row picking circuit selects one memory cell row is long in the order of the memory cell row picking circuit 142L, the memory cell row picking circuit 142M, the memory cell row picking circuit 142N, and the memory cell row picking circuit 142O, when the count signal is "00", the multiplexer 146 may select the memory cell row picking circuit 142L and output the flag signal Flag12. Furthermore, when the count signal is "01", the multiplexer 146 may select the memory cell row picking circuit 142M and output the flag signal Flag13, when the count signal is "10", the multiplexer 146 may select the memory cell row picking circuit 142N and output the flag signal Flag14, and when the count signal is "11", the multiplexer 146 may select the memory cell row picking circuit 142O and output the flag signal Flag15. However, embodiments are not limited thereto. For example, according to embodiments, the flag signal output from the multiplexer 146 in response to the count signal including the second bit, and the memory cell row picking circuit corresponding thereto, may be randomly determined regardless of the cycle of the row picking circuit.

In this way, the order by which the row addresses stored in the queues Q12, Q13, Q14, and Q15 are provided to the refresh control circuit 150 as the row hammer address RH_ADDR may be determined according to a fixed order, by a counter that outputs the count signal of a specific bit in order, and a multiplexer that outputs the flag signal corresponding to each memory cell row picking circuit (or queue assigned to the memory cell row picking circuit) in response to receiving the count signal from the counter.

Figure 13:
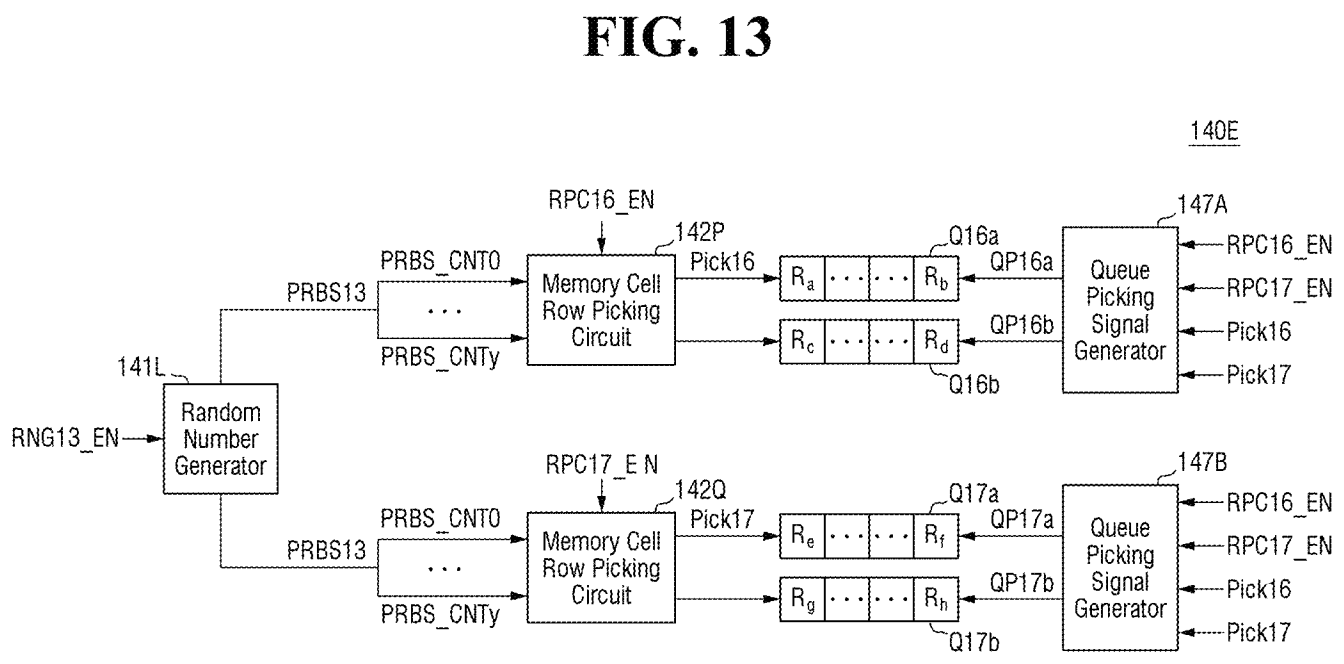
Figure 14:
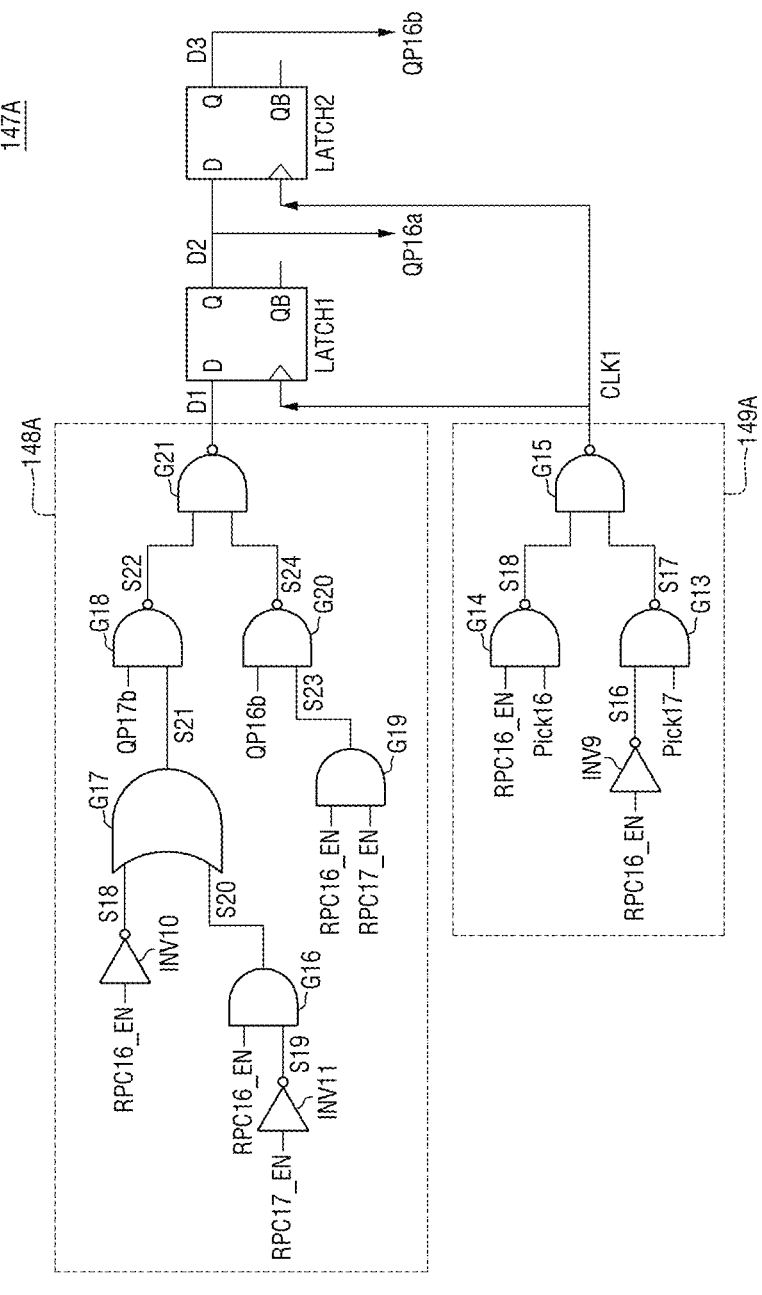
Figure 15:
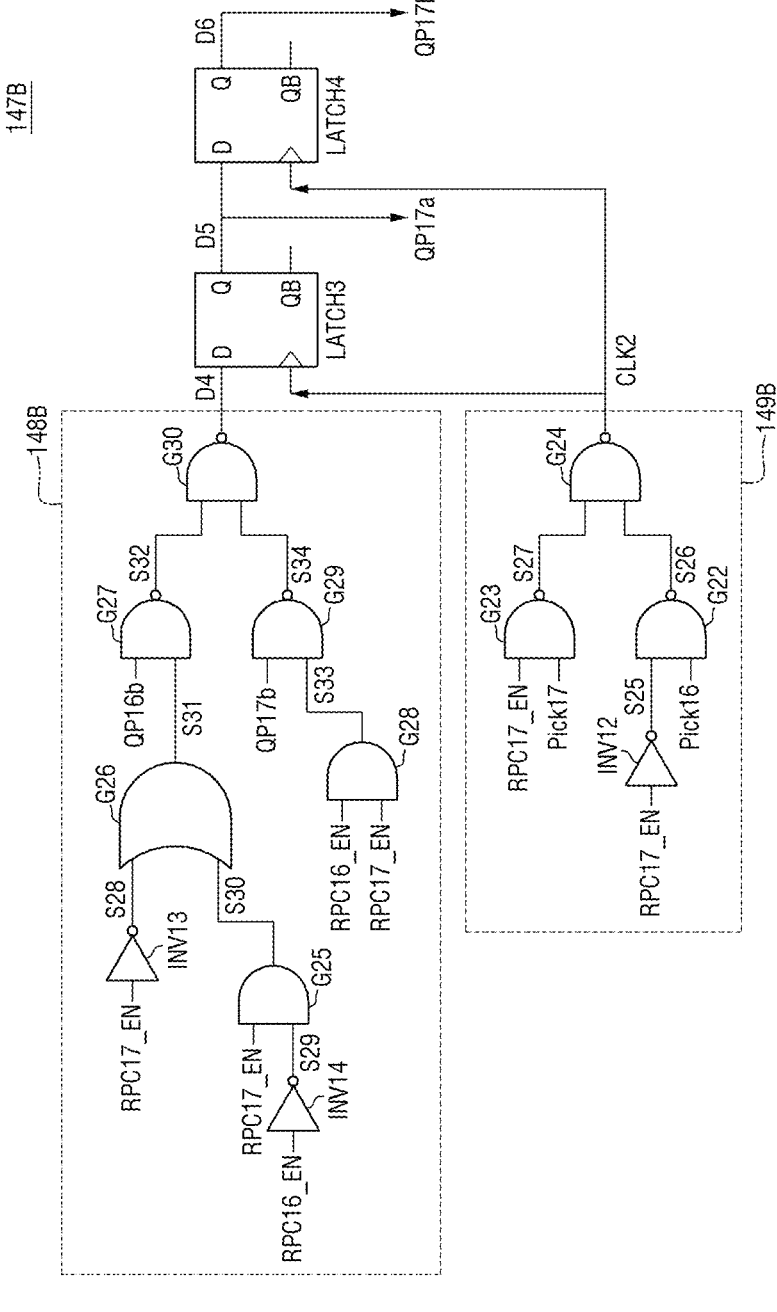

FIGS. 13 to 15 are example diagrams for describing a row hammer control circuit according to some embodiments.

First, referring to FIG. 13, the row hammer control circuit 140E may include a random number generator 141L that operates according to the enable signals RNG13_EN, and memory cell row picking circuits 142P and 142Q that operate according to the respective enable signals RPC16_EN and RPC17_EN. The random number generator 141L may output a y-bit pseudo random bit sequence signal PRBS13, and send the signal to the memory cell row picking circuits 142P and 142Q, respectively (here, y is an integer of 2 or more). The random number generator 141L may also be referred to as a random number generator circuit.

The memory cell row picking circuits 142P and 142Q may select the memory cell rows at different cycles from each other on the basis of the received signals and output the picking signals Pick16 and Pick17, respectively. The memory cell row picking circuit 142P may store the row address of one selected memory cell row in the queues Q16a and Q16b, when the picking signal Pick16 is logic high. At this time, the number of queues exclusively assigned to the memory cell row picking circuit 142P may be two or more. Similarly, the memory cell row picking circuit 142Q may store the row address of one selected memory cell row in the queues Q17a and Q17b, when the picking signal Pick17 is logic high. At this time, the number of queues exclusively assigned to the memory cell row picking circuit 142Q may also be two or more.

Although the row hammer control circuit 140E is shown in FIG. 13 to include one random number generator and two memory cell row picking circuits, embodiments are not limited thereto. For example, the number of random number generators and memory cell row picking circuits included in the row hammer control circuit 140E, and the number of memory cell row picking circuits that receive the pseudo random bit sequence signals from one random number generator, may vary according to embodiments.

In some embodiments, the row hammer control circuit 140E may include queue picking signal generators 147A and 147B. The queue picking signal generator 147A may generate a signal for selecting any one of the queues Q16a and Q16b exclusively assigned to the memory cell row picking circuit 142P. For example, when the memory cell row picking circuit 142P outputs the logic high picking signal Pick16, the row address of the memory cell row selected by the memory cell row picking circuit 142P may be stored in either queue Q16a or Q16b. At this time, when the queue picking signal generator 147A outputs the queue picking signal QP16a, the row address may be stored in the queue Q16a, and when the queue picking signal generator 147A outputs the queue picking signal QP16b, the row address may be stored in the queue Q16b.

Similarly, the queue picking signal generator 147B may generate a signal for selecting one of the queues Q17a and Q17b exclusively assigned to the memory cell row picking circuit 142Q. For example, when the memory cell row picking circuit 142Q outputs a logic high picking signal Pick17, the row address of the memory cell row selected by the memory cell row picking circuit 142Q may be stored in either queue Q17*a* or Q17*b*. At this time, when the queue picking signal generator 147B outputs the queue picking signal QP17*a*, the row address may be stored in the queue Q17*a*, and when the queue picking signal generator 147B outputs the queue picking signal QP17*b*, the row address may be stored in the queue Q17*b*.

At this time, each of the queue picking signal generator 147A and the queue picking signal generator 147B may output the queue picking signals QP16*a* and QP16*b* and the queue picking signals QP17*a* and QP17*b*, on the basis of the enable signals RPC16_EN and RPC17_EN and the picking signals Pick16 and Pick17.

As previously described with reference to FIG. 3, since the memory cell row picking circuit 142P and the memory cell row picking circuit 142Q operate by different enable signals from each other, any one of the memory cell row picking circuit 142P and the memory cell row picking circuit 142Q may be turned on to operate, and the other thereof may be turned off to not operate. Hereinafter, an example will be described in which the memory cell row picking circuit 142P is turned off when the enable signal RPC16_EN is in logic low state, and the memory cell row picking circuit 142Q is turned on when the enable signal RPC17_EN is in a logic high state. At this time, since the memory cell row picking circuit 142P does not operate, the picking signal Pick16 may be logic low, and since the memory cell row picking circuit 142Q operates, the picking signal Pick17 may be logic high.

FIG. 14 is an example diagram showing the queue picking signal generator 147A of FIG. 13. FIG. 15 is an example diagram showing the queue picking signal generator 147B of FIG. 13.

Referring to FIG. 14, the queue picking signal generator 147A may include a latch LATCH1, a latch LATCH2, a data signal generator 148A, and a clock signal generator 149A.

The latch LATCH1 may receive the clock signal CLK1 and output the input data signal D1 to the latch LATCH2 on the basis of the clock signal CLK1. At this time, the data signal D2 output from the latch LATCH1 is a signal obtained by delaying the data signal D1 by a predetermined time, and may correspond to the queue picking signal QP16*a*. The latch LATCH2 receives the clock signal CLK1 and may output a data signal D3 obtained by delaying the input data signal D2 by a predetermined period of time on the basis of the clock signal CLK1. At this time, the data signal D3 is a signal obtained by delaying the data signal D2 by a predetermined time, and may correspond to the queue picking signal QP16*b*.

The clock signal generator 149A may include an inverter INV9 and logic gates G13, G14, and G15. When the memory cell row picking circuit 142P is turned off, the inverter INV9 of the clock signal generator 149A may invert the logic low enable signal RPC16_EN to output the logic high signal S16. The logic gate G13 may receive the logic high signal S16 and the logic high picking signal Pick17, and perform the NAND computation to output the logic low signal S17.

The logic gate G14 may receive the logic low enable signal RPC16_EN and the logic low picking signal Pick16, and perform the NAND computation to output the logic high signal S18. The logic gate G15 may receive the logic high signal S18 and the logic low signal S17, and perform the NAND computation to output the logic high clock signal CLK1.

The data signal generator 148A may include inverters INV10 and INV11 and logic gates G16, G17, G18, G19, G20, and G21. The inverter INV10 may invert the logic low enable signal RPC16_EN to output the logic high signal S18. The inverter INV11 may invert the logic high enable signal RPC17_EN to output the logic low signal S19. The logic gate G16 may receive the logic low signal S19 and the logic low enable signal RPC16_EN, and perform the AND computation to output the logic low signal S20. The logic gate G1 may receive the logic high signal S18 and the logic low signal S20, and perform the OR computation to output the logic high signal S21.

The logic high signal S21 and the queue picking signal QP17*b* may be input to the logic gate G18. At this time, since the memory cell row picking circuit 142P is in a turned-off state, the row address of the memory cell row selected by the memory cell row picking circuit 142P may not be stored any longer in the queues Q16*a* and Q16*b* that are exclusively assigned to the existing memory cell row picking circuit 142P. Accordingly, another memory cell row picking circuit 142Q included in the row hammer control circuit 140E may additionally utilize the queues Q16*a* and Q16*b* in addition to the existing exclusively assigned queues Q17*a* and Q17*b*. That is, the row address of the memory cell row selected by the memory cell row picking circuit 142Q may be stored in the queues Q16*a*, Q16*b*, Q17*a*, and Q17*b*.

Therefore, in order for the memory cell row picking circuit 142Q to utilize the queues Q16*a* and Q16*b*, the queue picking signal QP17*b* of the data signal generator 148A may be logic high, and the queue picking signal QP16*b* may be logic low. That is, as will be described below with reference to FIG. 15, the queue picking signal QP17*b* output from the latch LATCH4 of FIG. 15 may be input at logic high to the data signal generator 148A included in the queue picking signal generator 147A.

Therefore, the logic gate G18 may perform the NAND computation on the logic high queue picking signal QP17*b* and the logic high signal S21, and output the logic low signal S22. Meanwhile, the logic gate G19 may receive the logic low enable signal RPC16_EN and the logic high enable signal RPC17_EN, and perform the AND computation to output the logic low signal S23. The logic gate G20 may receive the logic low signal S23 and the logic low queue picking signal QP16*b*, and output a logic high signal S24. The logic gate G21 may receive the logic low signal S22 and the logic high signal S24, and perform the NAND computation to output the logic high data signal D1.

In this way, when the clock signal CLK1 is logic high and the data signal D1 input to the latch LATCH1 is "1" corresponding to logic high, the latch LATCH1 may receive the data signal D1, and output the data signal D2 corresponding to logic high, that is, the logic high queue picking signal QP16*a*, after a predetermined period of time elapses. After that, when the clock signal CLK1 is logic high and the data signal D2 input to the latch LATCH2 is "1" corresponding to logic high, the latch LATCH2 receives the data signal D2, and may output the data signal D3 corresponding to logic high, that is, the logic high queue picking signal QP16*b*, after a predetermined period of time elapses.

In this way, when the memory cell row picking circuit 142P is turned off and the memory cell row picking circuit 142Q is turned on, as the logic high queue picking signal QP17*b* and the logic low queue picking signal QP16*b* are applied to the data signal generator 148A, the logic high queue picking signal QP16*a* and the queue picking signal QP16*b* may be output from the latch LATCH1 and the latch LATCH2, respectively. Accordingly, the row address of the memory cell row selected by the memory cell row picking circuit 142Q may also be stored in the queues Q16a and Q16b that were exclusively assigned to the existing memory cell row picking circuit 142P.

Referring to FIG. 15, the queue picking signal generator 147B may include a latch LATCH3, a latch LATCH4, a data signal generator 148B, and a clock signal generator 149B.

The latch LATCH3 may receive the clock signal CLK2 and output the input data signal D4 to the latch LATCH4 on the basis of the clock signal CLK2. At this time, the data signal D5 output from the latch LATCH3 is a signal obtained by delaying the data signal D4 by a predetermined time, and may correspond to the queue picking signal QP17a. The latch LATCH4 may receive the clock signal CLK2, and output a data signal D6 obtained by delaying the input data signal D5 by a predetermined period of time on the basis of the clock signal CLK2. At this time, the data signal D6 is a signal obtained by delaying the data signal D5 by a predetermined time, and may correspond to the queue picking signal QP17b.

The clock signal generator 149B may include an inverter INV12 and logic gates G22, G23, and G24. When the memory cell row picking circuit 142P is turned off, the inverter INV12 of the clock signal generator 149B may invert the logic high enable signal RPC17_EN to output a logic low signal S25. The logic gate G22 may receive the logic low signal S25 and the logic low picking signal Pick16, and perform the NAND computation to output a logic high signal S26.

The logic gate G23 may receive the logic high enable signal RPC17_EN and the logic high picking signal Pick17, and perform the NAND computation to output a logic low signal S27. The logic gate G24 may receive the logic high signal S26 and the logic low signal S27, and perform the NAND computation to output a logic high clock signal CLK2.

The data signal generator 148B may include inverters INV13 and INV14 and logic gates G25, G26, G27, G28, G29, and G30. The inverter INV13 may invert the logic high enable signal RPC17_EN to output a logic low signal S28. The inverter INV14 may invert the logic low enable signal RPC16_EN to output a logic high signal S29. The logic gate G25 may receive the logic high signal S29 and the logic high enable signal RPC17_EN, and perform the AND computation to output a logic high signal S30. The logic gate G26 may receive the logic high signal S30 and the logic low signal S28, and perform the OR computation to output a logic high signal S31.

The logic high signal S31 and the queue picking signal QP16b may be input to the logic gate G27. As described above with reference to FIG. 14, as the memory cell row picking circuit 142Q is able to additionally utilize the queues Q16a and Q16b other than the existing exclusively assigned queues Q17a and Q17b, in order for the memory cell row picking circuit 142Q to use the queues Q16a, Q16b, the queue picking signal QP17b input to the data signal generator 148B may be logic low, and the queue picking signal QP16b may be logic high.

Therefore, the logic gate G27 may perform the NAND computation on the logic high queue picking signal QP16b and the logic high signal S31, and output a logic low signal S32. Meanwhile, the logic gate G28 may receive the logic low enable signal RPC16_EN and the logic high enable signal RPC17_EN, and perform the AND computation to output a logic low signal S33. The logic gate G29 may receive the logic low signal S33 and the logic low queue picking signal QP17b, and output a logic high signal S34.

The logic gate G30 may receive the logic low signal S32 and the logic high signal S34, and perform the NAND computation to output a logic high data signal D4.

In this way, when the clock signal CLK2 is logic high and the data signal D4 input to the latch LATCH3 is "1" corresponding to logic high, the latch LATCH3 receives the data signal D4, and may output the data signal D5 corresponding to logic high, that is, the logic high queue picking signal QP17a, after a predetermined period of time elapses. Thereafter, when the clock signal CLK2 is logic high and the data signal D5 input to the latch LATCH4 is "1" corresponding to logic high, the latch LATCH4 may receive the data signal D5, and may output the data signal D6 corresponding to the logic high level, that is, the logic high queue picking signal QP17b, after a predetermined period of time elapses.

As a result, when the memory cell row picking circuit 142P is turned off and the memory cell row picking circuit 142Q is turned on, as the logic high queue picking signal QP16b and the logic low queue picking signal QP17b are applied to the data signal generator 148B, the logic high queue picking signal QP17a and the queue picking signal QP17b may be output from the latch LATCH3 and the latch LATCH4, respectively. As a result, the row address of the memory cell row selected by the memory cell row picking circuit 142Q may also be stored in the queues Q17a and Q17b, which have been exclusively assigned to the memory cell row picking circuit 142Q from the beginning, in addition to the queues Q16a and Q16b that are additionally assigned to the memory cell row picking circuit 142P.

Although a case in which the memory cell row picking circuit 142P is turned off has been described as an example with reference to FIGS. 13 to 15, embodiments are not limited thereto. For example, according to embodiments, when the enable signal RNG13_EN becomes a logic low state and the random number generator 141L is turned off, the memory cell row picking circuits 142P and 142Q also do not operate any longer, and the picking signals Pick16 and Pick17 may become logic low. At this time, if the row hammer control circuit 140E further includes another random number generator, the memory cell row picking circuit that receives the pseudo random bit sequence signal from the random number generator may additionally store the row address of the memory cell row selected by oneself in the queues Q16a, Q16b, Q17a, and Q17b.

Figure 16:
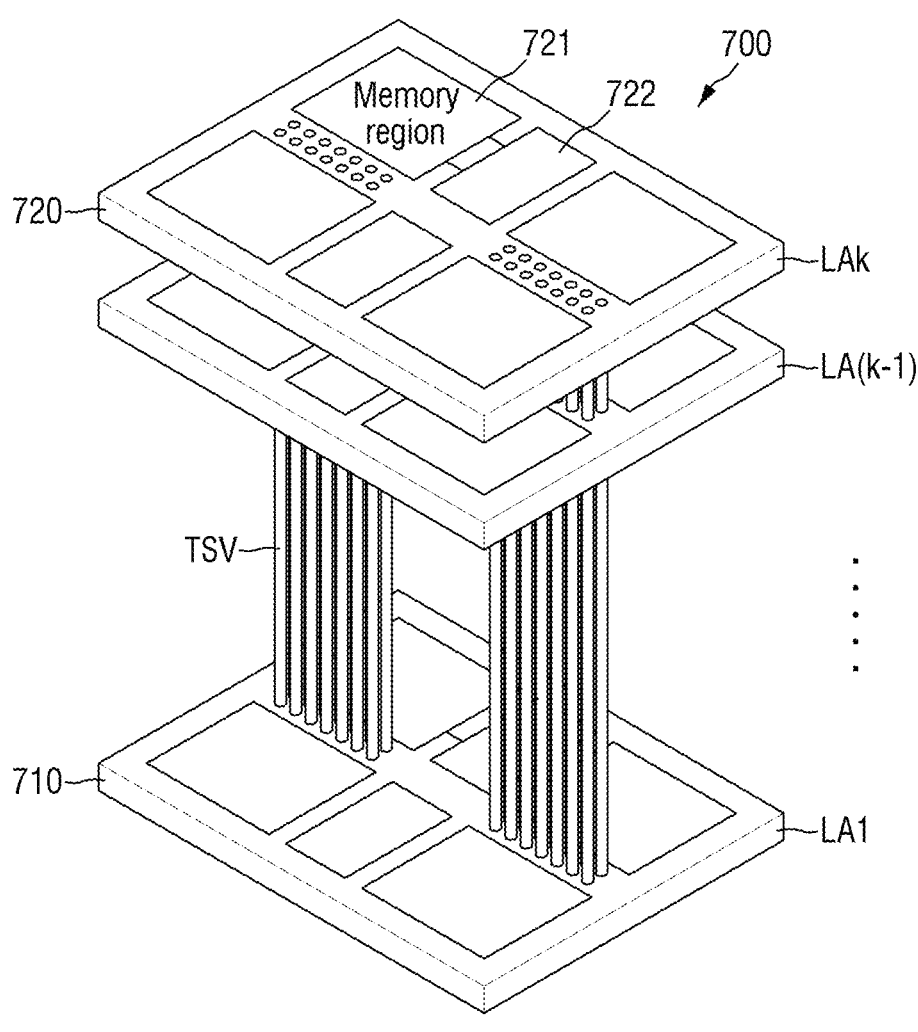
FIG. 16 is an example diagram showing a structure of a stacked memory device according to some embodiments.
Figure 17:
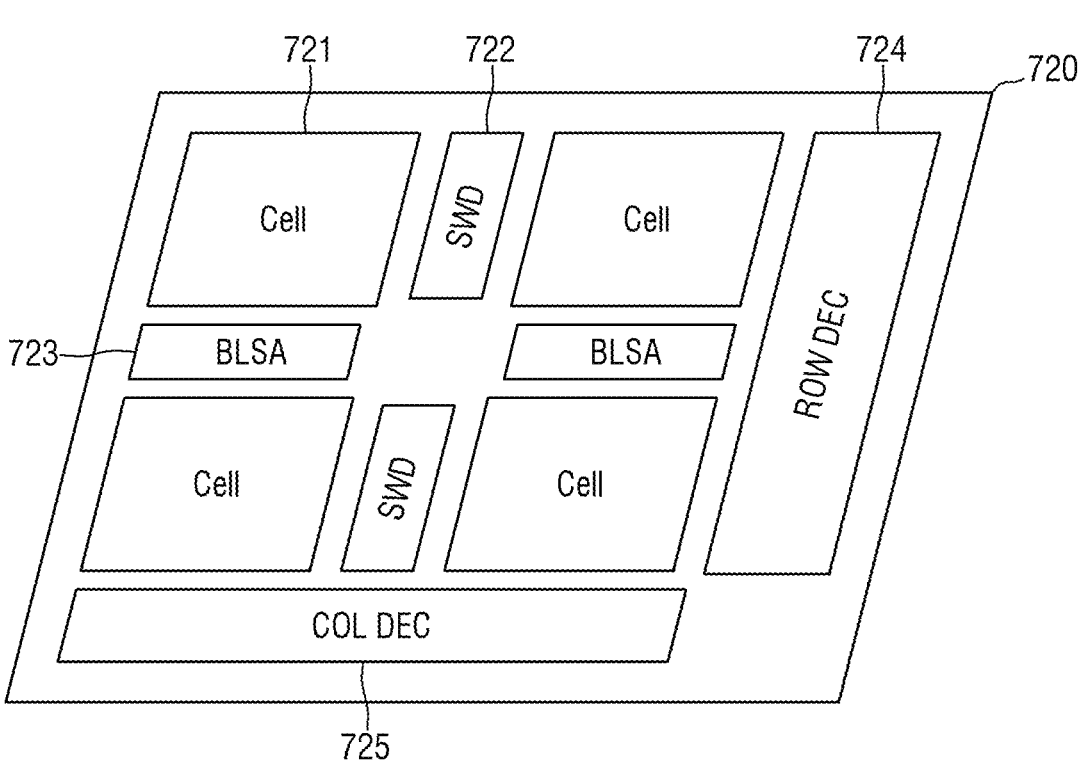
FIG. 17 is an example diagram showing a second semiconductor layer of FIG. 16.

FIG. 16 is an example diagram showing a structure of a stacked memory device according to some embodiments. FIG. 17 is an example diagram showing the second semiconductor layer of FIG. 16.

Referring to FIGS. 16 and 17, a memory device 700 may include a plurality of semiconductor dies or semiconductor layers LA1 to Lak (here, k is an integer of 3 or more). The memory device 700 may correspond to the memory device 100 of FIG. 1. A semiconductor layer LA1 located at the bottom may be a master layer, and remaining semiconductor layers LA2 to LAk may be slave layers.

The semiconductor layers LA1 to LAk send and receive signals through a through-silicon via (TSV), and the master layer LA1 may communicate with an external memory controller 200 (shown in FIG. 1) through conductive means formed on an outer surface. The configuration and operation of the semiconductor memory device 700 will be described below, centering on the first semiconductor layer 710 as the master layer and a k-th semiconductor layer 720 as the slave layer.

The first semiconductor layer 710 and the k-th semiconductor layer 720 include various peripheral circuits 722 that drive a memory region 721. For example, as described with reference to FIG. 2, the peripheral circuits 722 may include a row driver (X-Driver) that drives the word line of each memory region, a column driver (Y-Driver) that drives the bit line of each memory region, a data input/output unit that controls input and output of data, a command buffer that receives and buffers the command CMD received from outside of the semiconductor memory device 700, and an address buffer 120 (shown in FIG. 2) that receives and buffers the address received from outside of the semiconductor device 700.

The first semiconductor layer 710 may further include the control logic circuit 130 (shown in FIG. 1). The control logic circuit may control access to the memory region 721 on the basis of command and address signals provided from the memory controller (200 in FIG. 1), and generate control signals for accessing the memory region 721.

According to some embodiments, the second semiconductor layer 720 may include a plurality of memory cell regions. For example, the second semiconductor layer 720 may include four memory cell regions 721, and may include a bit line sense amplifier region 723 for sensing data of each memory cell between the memory cell regions 721, a sub word line driver region (SWD) 722, a row decoder 724, and a column decoder 725.

Figure 18:
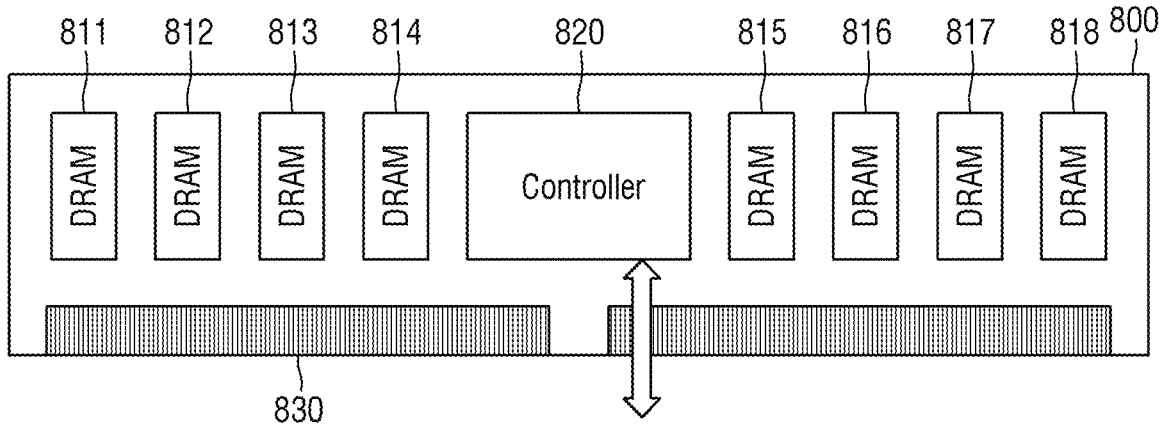
FIG. 18 is an example diagram for describing a memory module including a memory device according to some embodiments.

FIG. 18 is an example diagram for describing a memory module including a memory device according to some embodiments.

Referring to FIG. 18, according to some embodiments, a memory device 800 may be mounted on an electronic device in the form of a memory module. At least one or memory devices 800 may be mounted. The memory device 800 may correspond to the memory device 100 of FIG. 1.

The memory device 800 may include a plurality of volatile memories 811 to 818, a memory controller 820, and a plurality of memory input/output pins 830. The memory controller 820 may correspond to the memory controller 200 of FIG. 1. The memory device 800 may write data or output the written data under the control of an external CPU.

When the memory device 800 includes a DRAM, the CPU may control the memory device 800 according to communication protocols such as, for example, Double Data Rate (DDR) and Low Power DDR (LPDDR). For example, the CPU sends the command and the address to the memory device 800 to read data stored in the memory device 800.

The plurality of volatile memories 811 to 818 may be at least one of, for example, a DRAM and an SDRAM according to some embodiments. Each of the plurality of volatile memories 811 to 818 may perform communication of data DQ in response to the signal provided from the memory controller 820. According to some embodiments, the memory device 800 may further include data buffers for data communication, and the data buffers may transmit and receive data DQ to and from the memory controller 820 in synchronization with the data strobe signals DQS.

The memory controller 820 may communicate with the plurality of volatile memories 811 to 818 according to one of standards of the memory module, such as, for example, a Dual In-line Memory Module (DIMM), a Registered DIMM (RDIMM), a Load Reduced DIMM (LRDIMM), and an Unregistered Dual In-Line Memory Module (UDIMM), according to some embodiments.

The memory controller 820 may receive command/address signals CA and a clock signal CLK of the memory device 800 through the memory input/output pins 830, and provide the received signals to the plurality of volatile memory devices 811 to 818, according to some embodiments.

Figure 19:
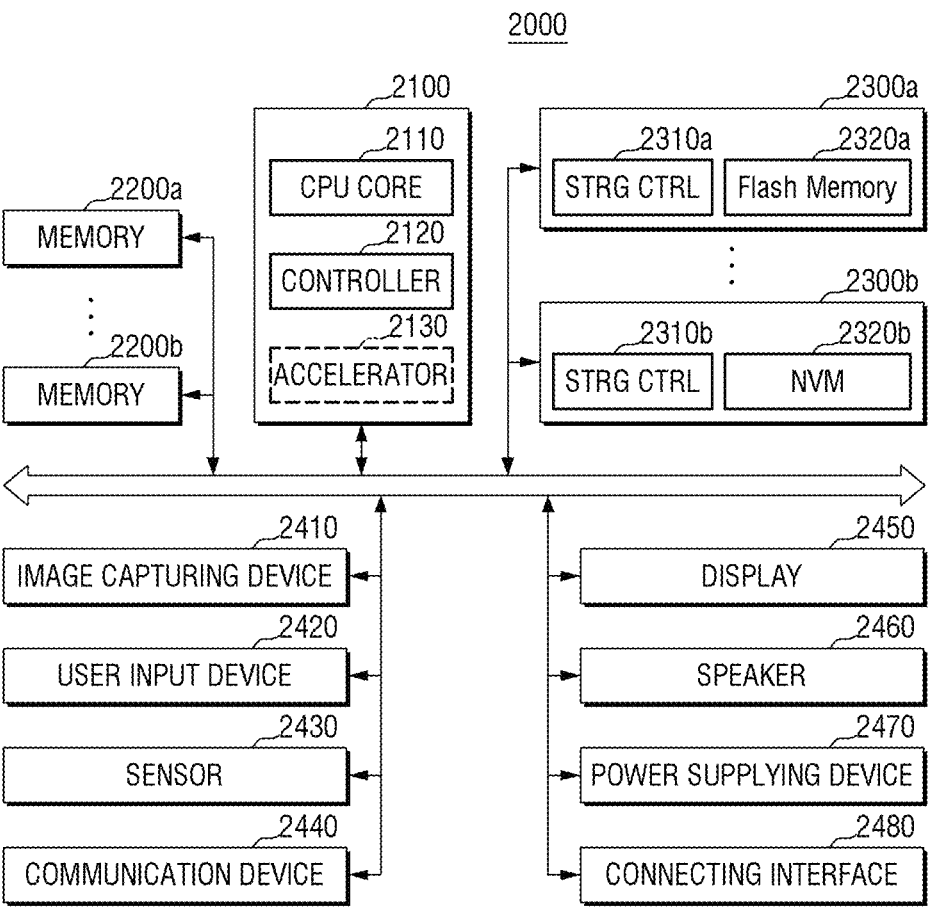
FIG. 19 is an example diagram showing an electronic system including the memory device according to some embodiments.

FIG. 19 is an example diagram showing an electronic system including the memory device according to some embodiments.

Referring to FIG. 19, an electronic system 2000 according to some embodiments may be a mobile system, such as, for example, a mobile phone, a smartphone, a tablet PC (tablet personal computer), a wearable device, a healthcare device or an Internet of Things (IoT) device. However, the electronic system 2000 of FIG. 19 is not limited to a mobile system. For example, according to embodiments, the electronic system 2000 may also be a personal computer, a laptop computer, a server, a media player or an automotive device such as a navigation device.

The electronic system 2000 may include a main processor 2100, memories 2200a and 2200b, and storage devices 2300a and 2300b, and may additionally include one or more of an image capturing device 2410, a user input device 2420, a sensor 2430, a communication device 2440, a display 2450, a speaker 2460, a power supplying device 2470, and a connecting interface 2480.

Hereinafter, at least one of the memories 2200a and 2200b is assumed to be at least one of the memory devices according to some embodiments described with reference to FIGS. 1 to 28.

The main processor 2100 may control the overall operations of the electronic system 2000, for example, the operations of other components that form the electronic system 2000. Such a main processor 2100 may be implemented as, for example, a general purpose processor, a dedicated processor, an application processor, or the like.

The main processor 2100 may include one or more CPU cores 2110, and may further include a controller 2120 that controls the memories 2200a and 2200b and/or the storage devices 2300a and 2300b. According to embodiments, the main processor 2100 may further include an accelerator 2130, which is a dedicated circuit for a high-speed data computation such as artificial intelligence (AI) data computation. Such an accelerator 2130 may include, for example, a Graphics Processing Unit (GPU), a Neural Processing Unit (NPU) and/or a Data Processing Unit (DPU), and the like, and may be implemented as separate chips that are physically independent of other components of the main processor 2100.

The memories 2200a and 2200b may be used as a main memory unit of the electronic system 2000, and may include a volatile memory such as, for example, an SRAM and/or a DRAM, but may also include a non-volatile memory such as, for example, a flash memory, a PRAM and/or a RRAM. The memories 2200a and 2200b may also be implemented in the same package as the main processor 2100.

The storage devices 2300a and 2300b may function as nonvolatile storage devices for storing data regardless of whether power is supplied, and may have a relatively larger capacity than the memories 2200a and 2200b. The storage devices 2300a and 2300b may include storage controllers 2310a and 2310b, and non-volatile memories (NVM) 2320a and 2320b that store data under the control of the storage controllers 2310a and 2310b. The non-volatile memories 2320a and 2320b may include a flash memory of a 2-dimensional (2D) structure or a 3-dimensional (3D) Vertical NAND (V-NAND) structure, but may also include other types of non-volatile memory such as, for example, a PRAM and/or a RRAM.

The storage devices 2300a and 2300b may be included in the electronic system 2000 in a state of being physically separated from the main processor 2100, and may be implemented in the same package as the main processor 2100.

Further, since the storage devices 2300*a* and 2300*b* may be, for example, a solid state device (SSD) or a memory card, the storage devices 2300*a* and 2300*b* may also be detachably coupled with other constituent elements of the electronic system 2000 through an interface such as a connecting interface 2480 to be described below. Such storage devices 2300*a* and 2300*b* may be, but are not necessarily limited to, devices to which standard protocols such as, for example, a universal flash storage (UFS), an embedded multi-media card (eMMC) or a non-volatile memory express (NVMe) protocol.

The image capturing device 2410 may capture still images or moving images, and may be, for example, a camera, a camcorder, and/or a webcam and the like.

The user input device 2420 may receive various types of data that are input from users of the electronic system 2000, and may be, for example, a touch pad, a keypad, a keyboard, a mouse and/or a microphone.

The sensor 2430 may detect various types of physical quantities that may be acquired from outside of the electronic system 2000, and convert the detected physical quantities into electrical signals. Such a sensor 2430 may be, for example, a temperature sensor, a pressure sensor, an illuminance sensor, a position sensor, an acceleration sensor, a biosensor and/or a gyroscope sensor.

The communication device 2440 may transmit and receive signals to and from other devices outside the electronic system 2000 according to various communication protocols. Such a communication device 2440 may be implemented to include, for example, an antenna, a transceiver and/or a modem and the like.

The display 2450 and the speaker 2460 may each function as output devices that output visual and auditory information to the user of the electronic system 2000.

The power supplying device 2470 may appropriately convert the power supplied from a battery equipped in the electronic system 2000 and/or an external power source, and supply the power to each constituent element of the electronic system 2000.

The connecting interface 2480 may provide a connection between the electronic system 2000 and an external device that may be connected to the electronic system 2000 to send and receive data to and from the electronic system 2000. The connecting interface 2480 may be implemented by various interface types, such as, for example, an Advanced Technology Attachment (ATA), a Serial ATA (SATA), an external SATA (e-SATA), a Small Computer Small Interface (SCSI), a Serial Attached SCSI (SAS), a Peripheral Component Interconnection (PCI), a PCI express (PCIe), a NVMe, an IEEE 1394, a Universal Serial Bus (USB), a secure digital (SD) card, a Multi-Media Card (MMC), an eMMC, a UFS, an embedded Universal Flash Storage (eUFS), and a Compact Flash (CF) card interface.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A memory device, comprising:

a memory cell array including a plurality of memory cell rows;

a first random number generator configured to generate an n-bit first pseudo random bit sequence signal based on a first seed and a first degree;

a first memory cell row picking circuit configured to randomly select a first memory cell row among the plurality of memory cell rows at a first cycle, in response to specific m bits among the generated n-bit first pseudo random bit sequence signal matching each other, and store a row address of the selected first memory cell row in a first queue;

a second memory cell row picking circuit configured to randomly select a second memory cell row among the plurality of memory cell rows at a second cycle different from the first cycle, in response to specific k bits among the generated n-bit first pseudo random bit sequence signal matching each other, and store a row address of the selected second memory cell row in a second queue different from the first queue; and a refresh control circuit configured to perform a refresh operation on memory cell rows physically adjacent to memory cell rows corresponding to each of the row addresses stored in the first queue and each of the row addresses stored in the second queue, wherein each of n, m, and k is an integer of 2 or more, and n, m, and k are different from each other.

2. The memory device of claim 1, further comprising:

a second random number generator configured to generate a j-bit second pseudo random bit sequence signal based on a second seed and a second degree; and a third memory cell row picking circuit configured to randomly select a third memory cell row among the plurality of memory cell rows at a third cycle different from the first cycle and the second cycle, in response to specific p bits among the generated j-bit second pseudo random bit sequence signal matching each other, and store a row address of the selected third memory cell row in a third queue different from the first queue and the second queue, wherein the refresh control circuit is configured to perform a refresh operation on memory cell rows physically adjacent to memory cell rows corresponding to each of the row addresses stored in the third queue, the first seed and the second seed are different from each other, or the first degree and the second degree are different from each other, and each of j and p is an integer of 2 or more, and j and p are different from each other.

3. The memory device of claim 2,
wherein in response to the first random number generator being powered off,
the third memory cell row picking circuit stores the row address of the selected third memory cell row in the first queue and the second queue.

4. The memory device of claim 2,
wherein in response to the second random number generator being powered off,
the first memory cell row picking circuit or the second memory cell row picking circuit stores the row address of the selected first memory cell row or the selected second memory cell row in the third queue.

5. The memory device of claim 1,
wherein first cycle is longer than the second cycle,
the first memory cell row picking circuit is configured to output a first picking signal of logic high, when randomly selecting the first memory cell row among the plurality of memory cell rows,
the first picking signal is input to a first flag signal generation circuit,
wherein the first flag signal generation circuit includes:
  a first inverter configured to invert the first picking signal and output a first signal;
  a first logic gate configured to:
    receive, as inputs, the first signal, and a second signal of a first node,
    perform a NAND computation on the first signal and the second signal, and
    output a third signal;
  a second logic gate configured to:
    receive, as inputs, a first enable signal, and the third signal,
    perform the NAND computation on the first enable signal and the third signal, and
    output the second signal of the first node; and
  a second inverter configured to invert the second signal and output a first flag signal,
wherein the first enable signal has a logic high level, in response to the first picking signal being logic high.

6. The memory device of claim 5,
wherein the second memory cell row picking circuit is configured to output a second picking signal of logic high, when the second memory cell row among the plurality of memory cell rows is randomly selected,
the second picking signal and the first flag signal are input to a second flag signal generation circuit,
wherein the second flag signal generation circuit includes:
  a third inverter configured to invert the first flag signal and output a fourth signal;
  a third logic gate configured to:
    receive, as inputs, the fourth signal, and the second picking signal,
    perform the NAND computation on the fourth signal and the second picking signal, and
    output a fifth signal;
  a fourth logic gate configured to:
    receive, as inputs, the fifth signal, and a sixth signal of a second node,
    perform the NAND computation on the fifth signal and the sixth signal, and
    output a seventh signal;
  a fifth logic gate configured to:
    receive, as inputs, a second enable signal, and the seventh signal,

perform the NAND computation on the second enable signal and the seventh signal, and
    output the sixth signal; and
  a fourth inverter configured to invert the sixth signal and output a second flag signal,
wherein the second enable signal has a logic low level in response to the first flag signal being logic high, and
the second enable signal has a logic high level in response to the first flag signal being logic low and the second picking signal being logic high.

7. The memory device of claim 1,
wherein in response to the number of m bits matching each other among the n-bit first pseudo random bit sequence signal being greater than the number of k bits matching each other among the n-bit first pseudo random bit sequence signal,
the refresh control circuit performs the refresh operation on memory cell rows physically adjacent to the memory cell rows corresponding to the row addresses stored in the first queue, in preference to the refresh operation on memory cell rows physically adjacent to the memory cell rows corresponding to the row addresses stored in the second queue.

8. The memory device of claim 1,
wherein in response to the first cycle being longer than the second cycle,
the refresh control circuit performs the refresh operation on memory cell rows physically adjacent to the memory cell rows corresponding to the row addresses stored in the first queue, in preference to the refresh operation on the memory cell rows physically adjacent to the memory cell rows corresponding to the row addresses stored in the second queue.

9. The memory device of claim 1, further comprising:
a queue picking circuit configured to receive the n-bit first pseudo random bit sequence signal from the first random number generator; and
a multiplexer configured to receive a signal including a first bit among the n-bit first pseudo random bit sequence signal from the queue picking circuit,
wherein the multiplexer outputs either a first flag signal corresponding to the first queue or a second flag signal corresponding to the second queue, in response to receiving the signal including the first bit.

10. The memory device of claim 9,
wherein in response to the multiplexer outputting the first flag signal,
the refresh control circuit performs the refresh operation on the memory cell rows physically adjacent to the memory cell rows corresponding to the row addresses stored in the first queue, in preference to the refresh operation on the memory cell rows physically adjacent to the memory cell rows corresponding to the row addresses stored in the second queue.

11. The memory device of claim 1, further comprising:
a counter configured to output a count signal including a first bit; and
a multiplexer configured to receive the count signal,
wherein the multiplexer outputs either a first flag signal corresponding to the first queue or a second flag signal corresponding to the second queue, in response to receiving the count signal.

12. The memory device of claim 11,
wherein in response to the multiplexer outputting the first flag signal,
the refresh control circuit performs the refresh operation on the memory cell rows physically adjacent to the memory cell rows corresponding to the row addresses stored in the first queue, in preference to the refresh operation on the memory cell rows physically adjacent to the memory cell rows corresponding to the row addresses stored in the second queue.

13. A memory system, comprising:

a memory controller configured to generate a row hammer refresh command based on a command received from a host;

a memory cell array including a plurality of memory cell rows;

a row hammer control circuit configured to receive the row hammer refresh command and output a row hammer address corresponding to at least one memory cell row that is subjected to a row hammer during a row hammer monitoring time interval among the plurality of memory cell rows, in response to the received row hammer refresh command;

a refresh control circuit configured to perform a refresh operation on memory cell rows physically adjacent to memory cell rows corresponding to the row hammer address, based on the received row hammer refresh command, wherein the row hammer control circuit includes:

a first random number generator configured to generate an n-bit first pseudo random bit sequence signal based on a first seed and a first degree;

a first memory cell row picking circuit configured to randomly select a first memory cell row among the plurality of memory cell rows at a first cycle, in response to specific m bits among the generated n-bit first pseudo random bit sequence signal matching each other, and store a row address of the selected first memory cell row in a first queue;

a second random number generator which is configured to generate a k-bit second pseudo random bit sequence signal based on a second seed and a second degree; and a second memory cell row picking circuit configured to randomly select a second memory cell row among the plurality of memory cell rows at a second cycle different from the first cycle, in response to specific j bits among the generated k-bit second pseudo random bit sequence signal matching each other, and store a row address of the selected second memory cell row in a second queue different from the first queue, wherein the row hammer control circuit provides the row addresses stored in the first queue and the row addresses stored in the second queue to the refresh control circuit as the row hammer address, the first seed and the second seed are different from each other, or the first degree and the second degree are different from each other, and each of n, m, k, and j is an integer of 2 or more.

14. The memory system of claim 13, further comprising:

a third memory cell row picking circuit configured to randomly select a third memory cell row among the plurality of memory cell rows at a third cycle different from the first cycle and the second cycle, in response to specific p bits among the generated n-bit first pseudo random bit sequence signal matching each other, and store the row address of the selected third memory cell row in a third queue different from the first queue and the second queue, wherein p is an integer of 2 or more, and p is different from m.

15. The memory system of claim 14, wherein in response to the first cycle being longer than the second cycle, and the second cycle being longer than the third cycle, the refresh control circuit performs:

the refresh operation on memory cell rows physically adjacent to the memory cell rows corresponding to the row addresses stored in the first queue, in preference to the refresh operation on the memory cell rows physically adjacent to the memory cell rows corresponding to the row addresses stored in the second queue, and the refresh operation on memory cell rows physically adjacent to the memory cell rows corresponding to the row addresses stored in the second queue, in preference to the refresh operation on the memory cell rows physically adjacent to the memory cell rows corresponding to the row addresses stored in the third queue.

16. The memory system of claim 13, wherein in response to the first memory cell row picking circuit being powered off, the second memory cell row picking circuit stores the row address of the selected second memory cell row in the first queue.

17. The memory system of claim 13, wherein in response to the first random number generator being powered off, the second memory cell row picking circuit stores the row address of the selected second memory cell row in the first queue.

18. A method of operating a memory device including a memory cell array including a plurality of memory cell rows, a first random number generator configured to generate an n-bit first pseudo random bit sequence signal, a first memory cell row picking circuit and a second memory cell row picking circuit configured to respectively randomly select at least one memory cell row among the plurality of memory cell rows based on the n-bit first pseudo random bit sequence signal, and a refresh control circuit configured to perform a refresh operation on memory cell rows physically adjacent to memory cell rows selected by the first memory cell row picking circuit and the second memory cell row picking circuit, the method comprising:

generating the n-bit first pseudo random bit sequence signal based on a first seed and a first degree, by the first random number generator, the n-bit first pseudo random bit sequence signal comprising multiple m bits that match each other or multiple k bits that match each other;

randomly selecting one memory cell row among the plurality of memory cell rows at a first cycle, by the first memory cell row picking circuit, in response to specific m bits among the generated n-bit first pseudo random bit sequence signal matching each other;

storing a row address of the memory cell row selected by the first memory cell row picking circuit in a first queue, by the first memory cell row picking circuit;

randomly selecting one memory cell row among the plurality of memory cell rows at a second cycle different from the first cycle, by the second memory cell row picking circuit, in response to specific k bits among the generated n-bit first pseudo random bit sequence signal matching each other;

storing the row address of the memory cell row selected by the second memory cell row picking circuit in a second queue different from the first queue, by the second memory cell row picking circuit; and performing a refresh operation on memory cell rows physically adjacent to the memory cell rows corresponding to each of row addresses stored in the first queue and each of the row addresses stored in the second queue, by the refresh control circuit, 5 wherein each of n, m, and k is an integer of 2 or more, and n, m, and k are different from each other.

19. The method of operating the memory device of claim 18, wherein there is no row address stored in the first queue, 10 and the first cycle is longer than the second cycle, and wherein performing the refresh operation on the memory cell rows physically adjacent to the memory cell rows corresponding to each of the row addresses stored in the first queue and each of the row addresses stored in 15 the second queue by the refresh control circuit includes:

performing the refresh operation on the memory cell rows physically adjacent to the memory cell rows corresponding to the row addresses stored in the second queue, by the refresh control circuit. 20

20. The method of operating the memory device of claim 18, wherein an enable signal is not applied to the first memory cell row picking circuit, and the method of operating the memory device further comprises: 25 storing the row address of the memory cell row selected by the second memory cell picking circuit in the first queue, by the second memory cell row picking circuit.

\*    \*    \*    \*    \* 30